United States Patent
Liaw

(10) Patent No.: US 9,768,179 B1
(45) Date of Patent: Sep. 19, 2017

(54) CONNECTION STRUCTURES FOR ROUTING MISALIGNED METAL LINES BETWEEN TCAM CELLS AND PERIPHERY CIRCUITS

(71) Applicant: Taiwan Semiconductor Manufacturing Co., Ltd., Hsin-Chu (TW)

(72) Inventor: Jhon Jhy Liaw, Hsinchu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 15/355,771

(22) Filed: Nov. 18, 2016

(51) Int. Cl.
| | |
|---|---|
| H01L 23/52 | (2006.01) |
| H01L 27/11 | (2006.01) |
| H01L 23/522 | (2006.01) |
| H01L 23/528 | (2006.01) |
| G11C 15/04 | (2006.01) |

(52) U.S. Cl.
CPC .......... H01L 27/1104 (2013.01); G11C 15/04 (2013.01); H01L 23/528 (2013.01); H01L 23/5226 (2013.01); H01L 27/1116 (2013.01)

(58) Field of Classification Search
CPC ... G11C 15/04; G11C 11/412; G06F 17/5077; H01L 27/11
USPC ....... 257/202, 208, 296, 300, 390; 365/49.1, 365/49.16, 189.011; 438/128, 129
See application file for complete search history.

(56) References Cited

U.S. PATENT DOCUMENTS

| | | | |
|---|---|---|---|
| 7,042,747 B1* | 5/2006 | Castagnetti | G11C 15/04 365/189.07 |
| 8,421,205 B2 | 4/2013 | Yang | |
| 8,605,523 B2 | 12/2013 | Tao et al. | |
| 8,630,132 B2 | 1/2014 | Cheng et al. | |
| 8,661,389 B2 | 2/2014 | Chern et al. | |
| 8,698,205 B2 | 4/2014 | Tzeng et al. | |
| 8,760,948 B2 | 6/2014 | Tao et al. | |
| 8,826,212 B2 | 9/2014 | Yeh et al. | |
| 8,836,141 B2 | 9/2014 | Chi et al. | |
| 9,183,933 B2 | 11/2015 | Liaw | |
| 2004/0114411 A1* | 6/2004 | Noda | G11C 15/043 365/49.17 |
| 2006/0203530 A1* | 9/2006 | Venkatraman | G11C 15/04 365/49.15 |
| 2013/0033915 A1* | 2/2013 | Lam | G11C 5/06 365/49.1 |
| 2014/0032871 A1 | 1/2014 | Hsu et al. | |
| 2014/0153321 A1 | 6/2014 | Liaw | |

(Continued)

Primary Examiner — S. V. Clark
(74) Attorney, Agent, or Firm — Haynes and Boone, LLP

(57) ABSTRACT

An electronic circuit includes a Ternary Content-Addressable Memory (TCAM) array. The TCAM array includes a plurality of TCAM cells that include a first signal line. The first signal line is located in a first metal layer. The TCAM array includes a connection structure that includes a first metal landing pad. The first metal landing pad is located in a second metal layer different from the first metal layer. The electronic circuit includes a periphery circuit located near the TCAM array. The periphery circuit includes a first metal line located in the first metal layer. The first metal line extends in a direction parallel to the first signal line but is misaligned with the first signal line in a planar view. The first metal landing pad is electrically coupled to both the first signal line and the first metal line.

20 Claims, 20 Drawing Sheets

(56) References Cited

U.S. PATENT DOCUMENTS

| | | |
|---|---|---|
| 2014/0153345 A1 | 6/2014 | Kim et al. |
| 2014/0177352 A1 | 6/2014 | Lum |
| 2014/0215420 A1 | 7/2014 | Lin et al. |
| 2014/0233330 A1 | 8/2014 | Ko et al. |
| 2014/0241077 A1 | 8/2014 | Katoch et al. |
| 2014/0264924 A1 | 9/2014 | Yu et al. |
| 2014/0269114 A1 | 9/2014 | Yang et al. |
| 2014/0282289 A1 | 9/2014 | Hsu et al. |
| 2014/0325466 A1 | 10/2014 | Ke et al. |

* cited by examiner

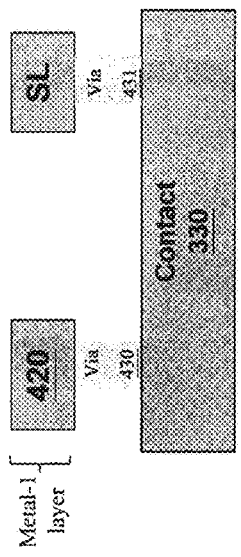
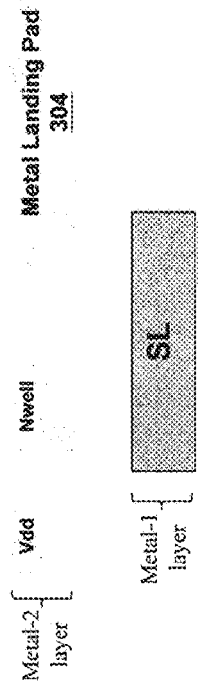
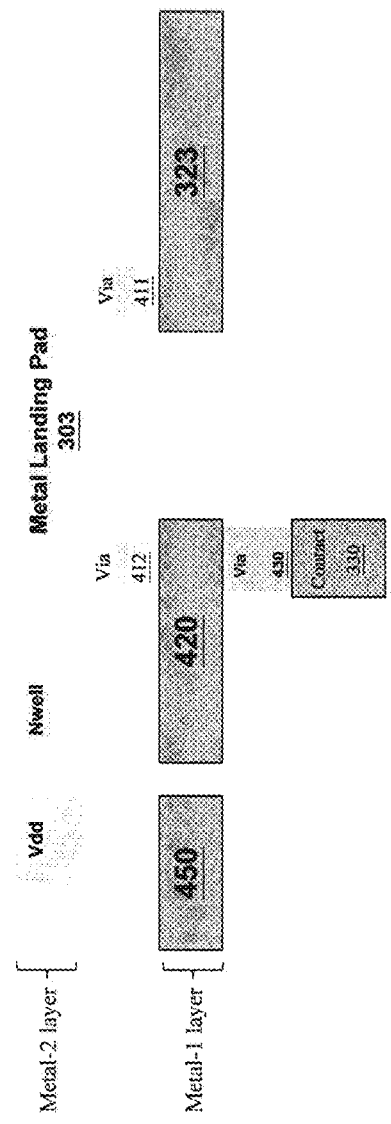
Fig. 14A
Fig. 14B
Fig. 14C

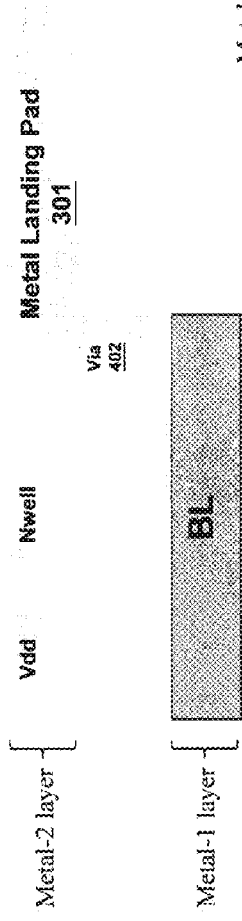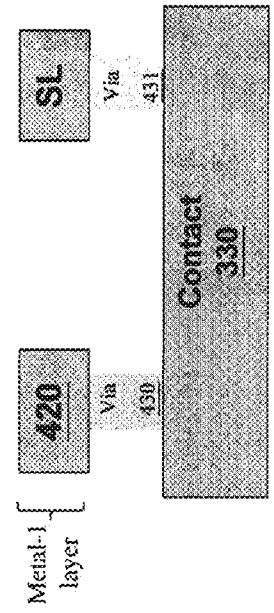
Fig. 18A
Fig. 18B
Fig. 18C

CONNECTION STRUCTURES FOR ROUTING MISALIGNED METAL LINES BETWEEN TCAM CELLS AND PERIPHERY CIRCUITS

BACKGROUND

The physical dimension of a feature on a chip is referred to as "feature size." Reducing the feature size on a chip permits more components to be fabricated on each chip, and more components to be fabrication on each silicon wafer, thereby reducing manufacturing costs on a per-wafer and a per-chip basis. Increasing the number of components in each chip can also improve chip performance because more components may become available to satisfy functional requirements. Some of the Integrated Circuit (IC) chips include Ternary Content-Addressable Memory (TCAM) devices, which are widely used in applications where fast search on a database is required. These applications may include, but are not limited to, networking, imaging, voice recognition, etc. For example, in network engines, TCAM devices may be used to perform a fast search in the database, corresponding to the header field of any packet, and forward the packet to the corresponding matched address. As the feature sizes on IC chips continue to get scaled down, routing problems may arise for TCAM devices.

Therefore, although existing TCAM devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

FIGS. 14A, 14B, and 14C are simplified cross-sectional views of different portions of FIG. 13 according to an embodiment of the present disclosure.

FIGS. 18A, 18B, and 18C are simplified cross-sectional views of different portions of FIG. 17 according to an embodiment of the present disclosure.

DETAILED DESCRIPTION

Figure 1:
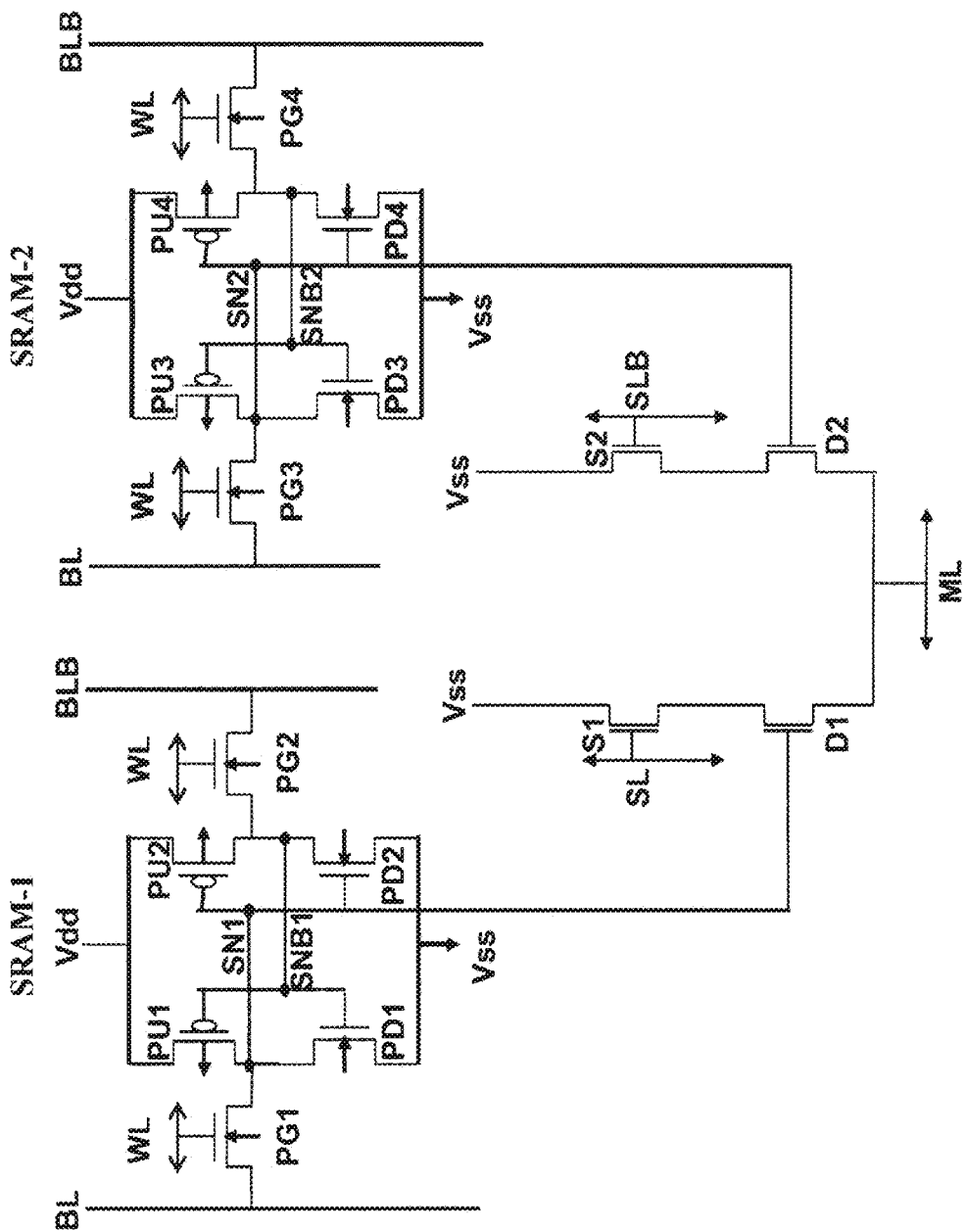
FIG. 1 is a circuit diagram of a first memory cell according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments disclosed herein will be described with respect to a specific context, namely a memory cell and array, and more particularly, a Ternary Content-Addressable Memory (TCAM) cell and array. Various modifications are discussed with respect to embodiments; however, other modifications may be made to the disclosed embodiments while remaining within the scope of the subject matter. A person of ordinary skill in the art will readily understand modifications that may be made.

FIG. 1 illustrates a circuit diagram of a first memory cell (e.g., a TCAM cell) according to an embodiment. The cell includes pull-up transistors PU1, PU2 PU3, and PU4; pull-down transistors PD1, PD2, PD3, and PD4; pass-gate transistors PG1, PG2, PG3, and PG4; search gate transistors S1 and S2; and data gate transistors D1 and D2. As show in the circuit diagram, transistors PU1, PU2, PU3, and PU4 are p-type transistors, such as planar p-type field effect transistors (PFETs) or p-type fin field effect transistors (finFETs), and transistors PG1, PG2, PG3, PG4, PD1, PD2, PD3, PD4, S1, S2, D1, and D2 are n-type transistors, such as planar n-type field effect transistors (NFETs) or n-type finFETs.

The transistors PG1, PG2, PU1, PU2, PD1, and PD2 may form a first Static Random Access Memory (SRAM) cell, hereinafter referred to as SRAM-1. The transistors PG3, PG4, PU3, PU4, PD3, and PD4 may form a second Static Random Access Memory (SRAM) cell, hereinafter referred to as SRAM-2. The two sets of cascaded transistors S1, D1 and S2, D2 form a data comparator. The two cells SRAM-1 and SRAM-2 and the data comparator collectively form a TCAM cell.

The drains of pull-up transistor PU1 and pull-down transistor PD1 are coupled together, and the drains of pull-up transistor PU2 and pull-down transistor PD2 are coupled together. Transistors PU1 and PD1 are cross-coupled with transistors PU2 and PD2 to form a first data latch. The gates of transistors PU2 and PD2 are coupled together and to the drains of transistors PU1 and PD1 to form a first storage node SN1, and the gates of transistors PU1 and PD1 are coupled together and to the drains of transistors PU2 and PD2 to form a complementary first storage node SNB1. Sources of the pull-up transistors PU1 and PU2 are coupled to power voltage Vdd, and the sources of the pull-down transistors PD1 and PD2 are coupled to a ground voltage Vss.

The first storage node SN1 of the first data latch is coupled to bit line BL through pass-gate transistor PG1, and the complementary first storage node SNB1 is coupled to complementary bit line BLB through pass-gate transistor PG2. The first storage node N1 and the complementary first storage node SNB1 are complementary nodes that are often at opposite logic levels (logic high or logic low). Gates of pass-gate transistors PG1 and PG2 are coupled to a word line WL.

The drains of pull-up transistor PU3 and pull-down transistor PD3 are coupled together, and the drains of pull-up transistor PU4 and pull-down transistor PD4 are coupled together. Transistors PU3 and PD3 are cross-coupled with transistors PU4 and PD4 to form a second data latch. The gates of transistors PU4 and PD4 are coupled together and to the drains of transistors PU3 and PD3 to form a second storage node SN2, and the gates of transistors PU3 and PD3 are coupled together and to the drains of transistors PU4 and PD4 to form a complementary second storage node SNB2. Sources of the pull-up transistors PU3 and PU4 are coupled to power voltage Vdd, and the sources of the pull-down transistors PD3 and PD4 are coupled to a ground voltage Vss.

The second storage node SN2 of the second data latch is coupled to bit line BL through pass-gate transistor PG3, and the complementary second storage node SNB2 is coupled to complementary bit line BLB through pass-gate transistor PG4. The second storage node N2 and the complementary second storage node SNB2 are complementary nodes that are often at opposite logic levels (logic high or logic low) Gates of pass-gate transistors PG3 and PG4 are coupled to a word line WL.

Together, the first and second data latches form a storage port SP of the memory cell. A match port MP of the memory cell is cascaded from the storage port SP. A source of the search gate transistor S1 is coupled to a ground voltage Vss. A drain of the search gate transistor S1 is coupled to a source of the data gate transistor D1. A drain of the data gate transistor D1 is coupled to a match line ML. A gate of the search gate transistor S1 is coupled to a search line SL, and a gate of the data gate transistor D1 is coupled to the first storage node SN1. A source of the search gate transistor S2 is coupled to a ground voltage Vss. A drain of the search gate transistor S2 is coupled to a source of the data gate transistor D2. A drain of the data gate transistor D2 is coupled to the match line ML. A gate of the search gate transistor S2 is coupled to a complementary search line SLB, and a gate of the data gate transistor D2 is coupled to the second storage node SN2.

Figure 2:
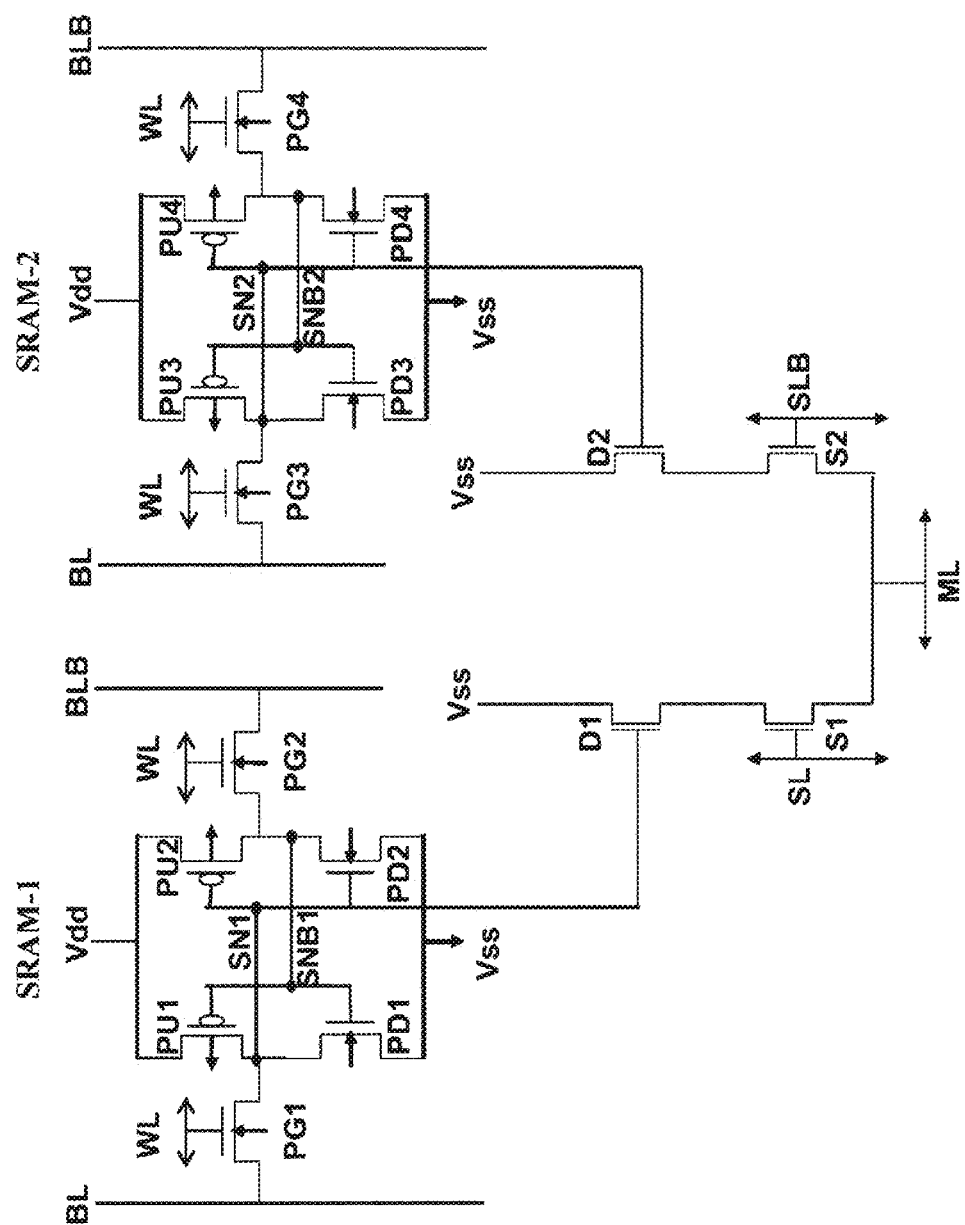
FIG. 2 is a circuit diagram of a second memory cell according to an embodiment of the present disclosure.

FIG. 2 illustrates a circuit diagram of a second memory cell (e.g., a TCAM cell) according to an embodiment. The storage port SP of the circuit diagram of FIG. 2 is configured in the same manner as the storage port SP of the circuit diagram of FIG. 1. A match port MP of the memory cell is cascaded from the storage port SP. A source of the data gate transistor D1 is coupled to a ground voltage Vss. A drain of the data gate transistor D1 is coupled to a source of the search gate transistor S1. A drain of the search gate transistor S1 is coupled to a match line ML. A gate of the search gate transistor S1 is coupled to a search line SL, and a gate of the data gate transistor D1 is coupled to the first storage node SN1. A source of the data gate transistor D2 is coupled to a ground voltage Vss. A drain of the data gate transistor D2 is coupled to a source of the search gate transistor S2. A drain of the search gate transistor S2 is coupled to the match line ML. A gate of the search gate transistor S2 is coupled to a complementary search line SLB, and a gate of the data gate transistor D2 is coupled to the second storage node SN2. Similar to the TCAM cell shown in FIG. 1, the TCAM cell shown in FIG. 2 also includes two SRAM cells (SRAM-1 and SRAM-2) and a data comparator formed by two sets of cascaded transistors (D1, S1, and D2, S2).

Figure 3:
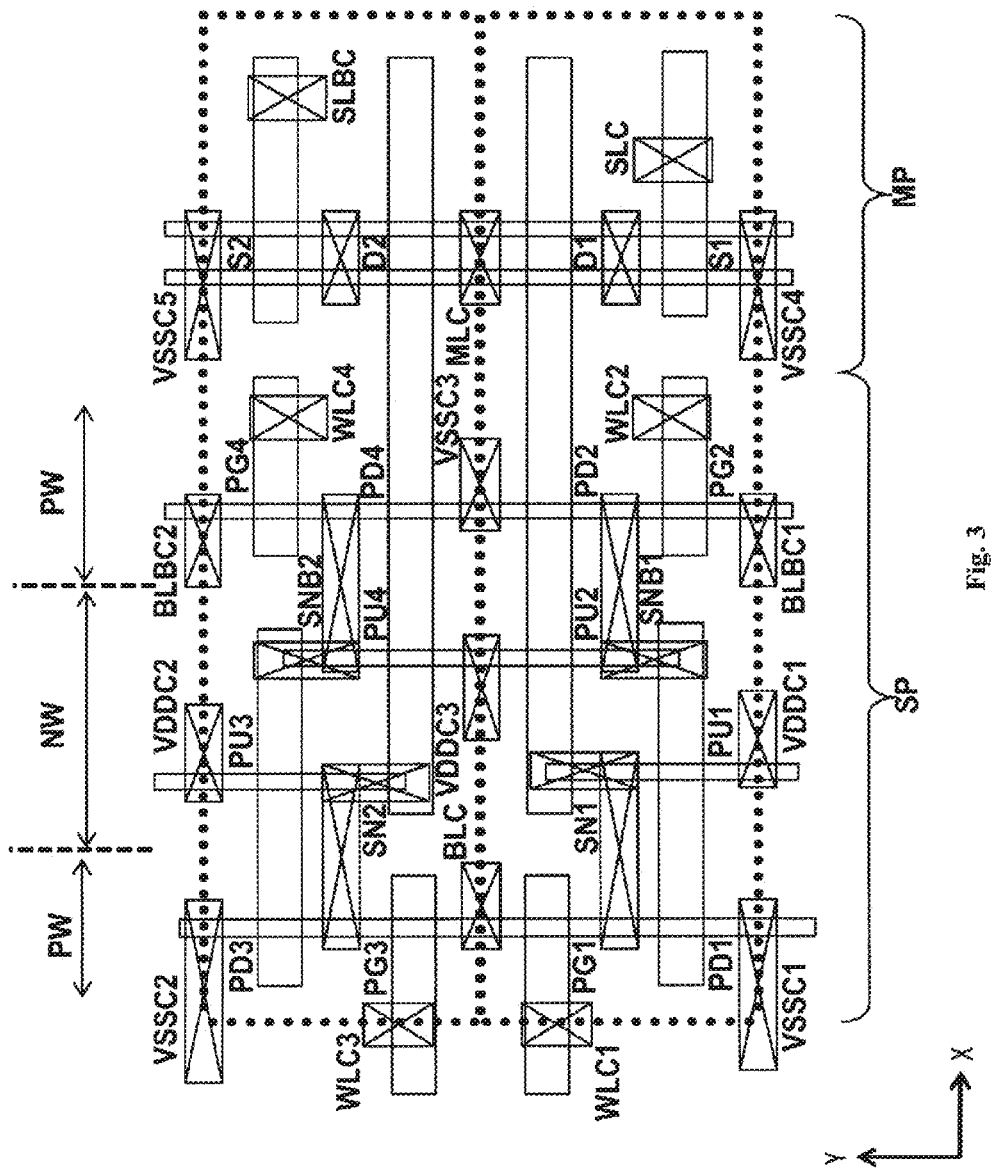
FIG. 3 is a first example cell layout for the cell in FIG. 1 according to an embodiment of the present disclosure.

FIG. 3 illustrates a first example cell layout for the cell in FIG. 1 according to an embodiment. Although a layout is discussed corresponding to the cell in FIG. 1, a person of ordinary skill in the art will readily understand how to modify the layout in FIG. 3 to correspond to the cell in FIG. 2. FIG. 3 illustrates two dashed boxes, where each dashed box represents a data latch portion and corresponding cascaded device portion. The data latch portions of both boxes represent the storage port SP, and the cascaded device portions of both boxes represent the match port MP. The exterior boundaries of the dashed boxes represent boundaries of the cell. The cell may be mirrored around any Y-direction exterior boundary or mirrored or translated around any X-direction exterior boundary to form a layout comprising more cells, such as an array of cells.

FIG. 3 illustrates seven distinct active areas formed in and/or on a substrate, such as a semiconductor substrate like bulk silicon, that are respective portions of the transistors PU1, PU2 PU3, PU4, PD1, PD2, PD3, PD4, PG1, PG2, PG3, PG4, S1, S2, D1, and D2. In other embodiments, there may be more or less active areas, such as the example in FIG. 8 (discussed in detail below), which may be used to control a width of a transistor for current matching. The active areas in FIG. 3 extend in the Y-direction, which also corresponds to a direction of current flow of the transistors during operation. Active areas depicted as crossing a boundary of the cell layout (illustrated by exterior dashed lines) may be shared by transistors of adjacent cells. FIG. 3 further illustrates boundaries between p-doped wells PW and n-doped well NW. The respective boundaries extend in a Y-direction. N-type transistors, as discussed in FIG. 1, may be formed in the p-doped wells PW, and p-type transistors, as discussed in FIG. 1, may be formed in the n-doped wells NW. The active areas may be planar in the substrate to form planar FETs and/or may be fins in the substrate to form finFETs.

One active area forms the source, channel, and drain regions of each of the transistors PD1, PG1, PG3, and PD3. One active area forms the source, channel, and drain regions of the transistor PU1, and another one active area forms the source, channel, and drain regions of the transistor PU3. The active areas for the transistors PU1 and PU3 may be substantially aligned along longitudinal axes (e.g., in a Y-direction). One active area forms the source, channel, and drain regions of each of the transistors PU2 and PU4. One active area forms the source, channel, and drain regions of each of the transistors PG2, PD2, PD4, and PG4. Two active areas form the source, channel, and drain regions of each of the transistors S1, D1, D2, and S2. The formation process of the transistors S1, D1, D2, and S2 may differ from the formation process of the transistors PD1, PD2, PD3, PD4, PG1, PG2, PG3, and PG4, such that, for example, a threshold voltage of transistor PD2 is a higher than a threshold voltage of transistor D1, such as the difference being larger than 30 mV.

FIG. 3 further illustrates 10 distinct gate structures, which may include a gate dielectric with a conductive material, such as doped polysilicon, a metal, and/or silicide, thereover. As depicted in FIG. 3, the gate structures extend in the X-direction. Transistors PD1 and PU1 share a common gate structure over respective channel regions of the transistors PD1 and PU1 Transistor PG1 has a gate structure over its channel region, and the gate structure may be shared by another transistor in an adjacent cell. Transistor PG3 has a gate structure over its channel region, and the gate structure may be shared by another transistor in an adjacent cell. Transistors PD3 and PU3 share a common gate structure over respective channel regions of the transistors PD3 and PU3. Transistors PU2, PD2, and D1 share a common gate structure over respective channel regions of the transistors PU2, PD2, and D1. Transistors PU4, PD4, and D2 share a common gate structure over respective channel regions of the transistors PU4, PD4, and D2. Transistor PG2 has a gate structure over its channel region, and transistor PG4 has a gate structure over its channel region. Transistor S1 has a gate structure over its channel region, and transistor S2 has a gate structure over its channel region.

FIG. 3 further illustrates various contacts formed to components in the cell. The contacts may be formed in a lower-most dielectric layer(s), such as an inter-layer dielectric (ILD), with a conductive material, such as a metal with or without a barrier layer. A first Vss contact VSSC1 is coupled to a source region of transistor PD1. A first Vdd contact VDDC1 is coupled to a source region of transistor PU1 A first complementary bit line contact BLBC1 is coupled to a source/drain region of transistor PG2. A fourth Vss contact VSSC4 is coupled to a source region of transistor S1, which may further electrically couple the two active areas of transistor S1. A first word line contact WLC1 is coupled to the gate structure of transistor PG1. A third word line contact WLC3 is coupled to the gate structure of transistor PG3. A second Vss contact VSSC2 is coupled to a source region of transistor PD3. A second Vdd contact VDDC2 is coupled to a source region of transistor PU3. A second complementary bit line contact BLBC2 is coupled to a source/drain region of transistor PG4. A fifth Vss contact VSSC5 is coupled to a source region of transistor S2, which may further electrically couple the two active areas of transistor S2. Each of the contacts VSSC1, VSSC2, VSSC4, VSSC5, VDDC1, VDDC2, BLBC1, BLBC2, WLC1, and WLC3 may be shared by one or more adjacent cells.

A bit line contact BLC is coupled to a source/drain region of transistors PG1 and PG3. A third Vdd contact VDDC3 is coupled to a source region of transistors PU2 and PU4. A third Vss contact VSSC3 is coupled to a source region of transistors PD2 and PD4. A second word line contact WL2 is coupled to a gate structure of transistor PG2. A fourth word line contact WLC4 is coupled to a gate structure of transistor PG4. A match line contact MLC is coupled to a drain region of transistors D1 and D2, which contact MLC also couples together the two active areas of transistors D1 and D2. A search line contact SLC is coupled to the gate structure of transistor S1. A complementary search line contact SLBC is coupled to the gate structure of transistor S2.

A first storage node contact SN1 couples together the drain of transistor PD1, a source/drain region of transistor PG1, the drain of transistor PU1, and the common gate structure for transistors PU2, PD2, and D1. The first storage node contact SN1 may comprise a butted contact between the active area of transistor PU1 and the common gate structure for transistors PU2, PD2, and D1. A first complementary storage node contact SNB1 couples together the drain of transistor PD2, a source/drain region of transistor PG2, the drain of transistor PU2, and the common gate structure for transistors PU1 and PD1. The first complementary storage node contact SNB1 may comprise a butted contact between the active area of transistor PU2 and the common gate structure for transistors PU1 and PD1. A second storage node contact SN2 couples together the drain of transistor PD3, a source/drain region of transistor PG3, the drain of transistor PU3, and the common gate structure for transistors PU4, PD4, and D2. The second storage node contact SN2 may comprise a butted contact between the active area of transistor PU3 and the common gate structure for transistors PU4, PD4, and D2. A second complementary storage node contact SNB2 couples together the drain of transistor PD4, a source/drain region of transistor PG4, the drain of transistor PU4, and the common gate structure for transistors PU3 and PD3. The second complementary storage node contact SNB2 may comprise a butted contact between the active area of transistor PU4 and the common gate structure for transistors PU3 and PD3. Respective contacts (unnumbered) couple active areas of transistors D1 and S1 together and of transistors S2 and D2 together.

Figure 4:
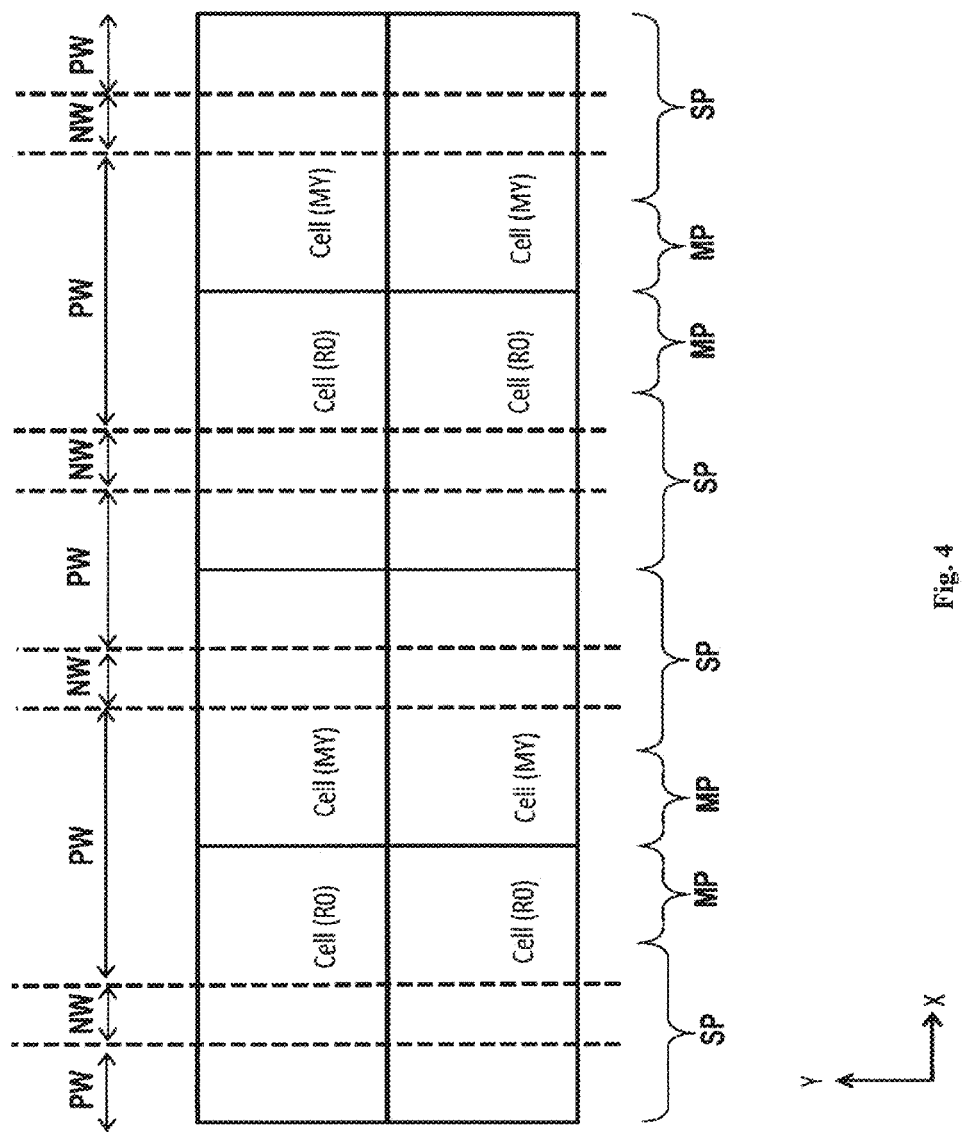
FIG. 4 is a 2×4 array of cells according to an embodiment of the present disclosure.

FIG. 4 illustrates a 2.times.4 array (2×4 array) of cells according to an embodiment. FIG. 4 illustrates an arrangement of p-doped wells PW and n-doped wells NW across multiple cells. Respective p-doped wells PW may extend in an X-direction (e.g., a row direction) across adjacent cells. Each of the n-doped wells NW and p-doped wells PW may extend in a Y-direction (e.g., column direction) across cells. FIG. 4 further illustrates corresponding storage ports SP and match ports MP among the cells, and illustrates how the cells may be mirrored along exterior boundaries. For example, cells may be mirrored in an X-direction (e.g., across a Y-direction cell boundary), which is indicated as mirror-across-Y MY. An original cell RO may be translated (or mirrored) in a Y-direction. Having wells PW and NW in this arrangement for each cell (e.g., PW-NW-PW) may increase a latch-up performance of the storage ports of the cells.

Figure 5:
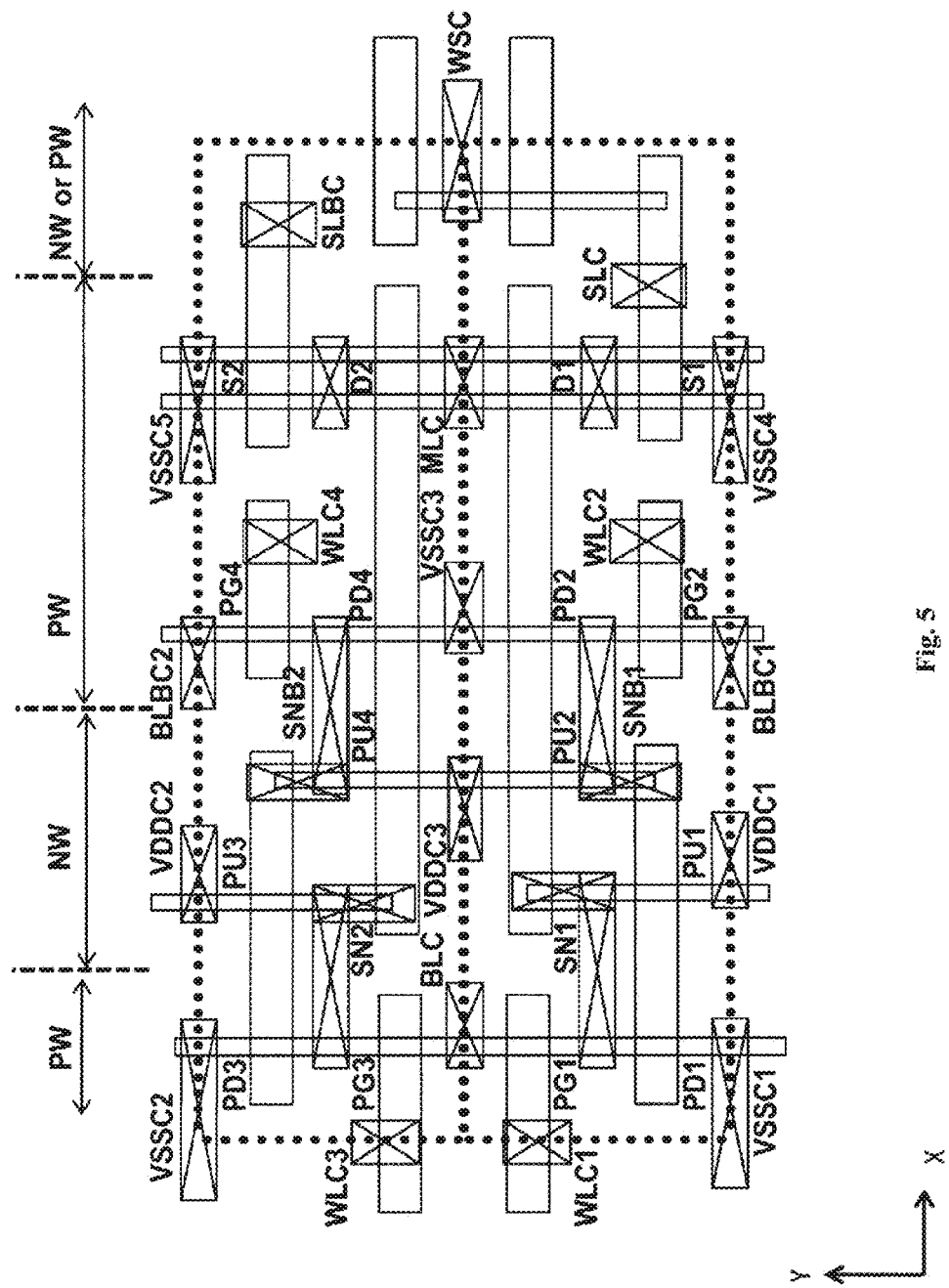
FIG. 5 is a second example cell layout for the cell in Fi according to an embodiment of the present disclosure.

FIG. 5 illustrates a second example cell layout for the cell in FIG. 1 according to an embodiment. Although a layout is discussed corresponding to the cell in FIG. 1, a person of ordinary skill in the art will readily understand how to modify the layout in FIG. 5 to correspond to the cell in FIG. 2. The cell in FIG. 5 is a modification of the cell in FIG. 3. FIG. 5 further includes another active area extending in the Y-direction, two gate structures over the active area, and a well strap contact WSC coupled to the active area. The additional active area and two gate structures form components of a well strap structure WSS in this embodiment. The active area extends from under the gate structure of transistor S1. The active area may be formed in an n-doped well NW or a p-doped well PW. The two gate structures are disposed on opposite sides of the well strap contact WSC in the Y-direction. The two gate structures may be shared with an adjacent cell. The two gate structures may be dummy gates and may be floating. Dummy gates may be used to increase a layout uniformity and may increase critical dimension control. With the dummy gates, the active area of the well strap structure WSS may be doped like a transistor formed in a corresponding well. For example, if the active area is in a p-doped well PW, the active area may be doped to form n-type source/drain regions, and the well strap contact WSC may be electrically coupled to a ground. Further, if the active area is in an n-doped well NW, the active area may be doped to form p-type source/drain regions, and the well strap contact WSC may be electrically coupled to a high voltage, such as power Vdd.

Figure 6:
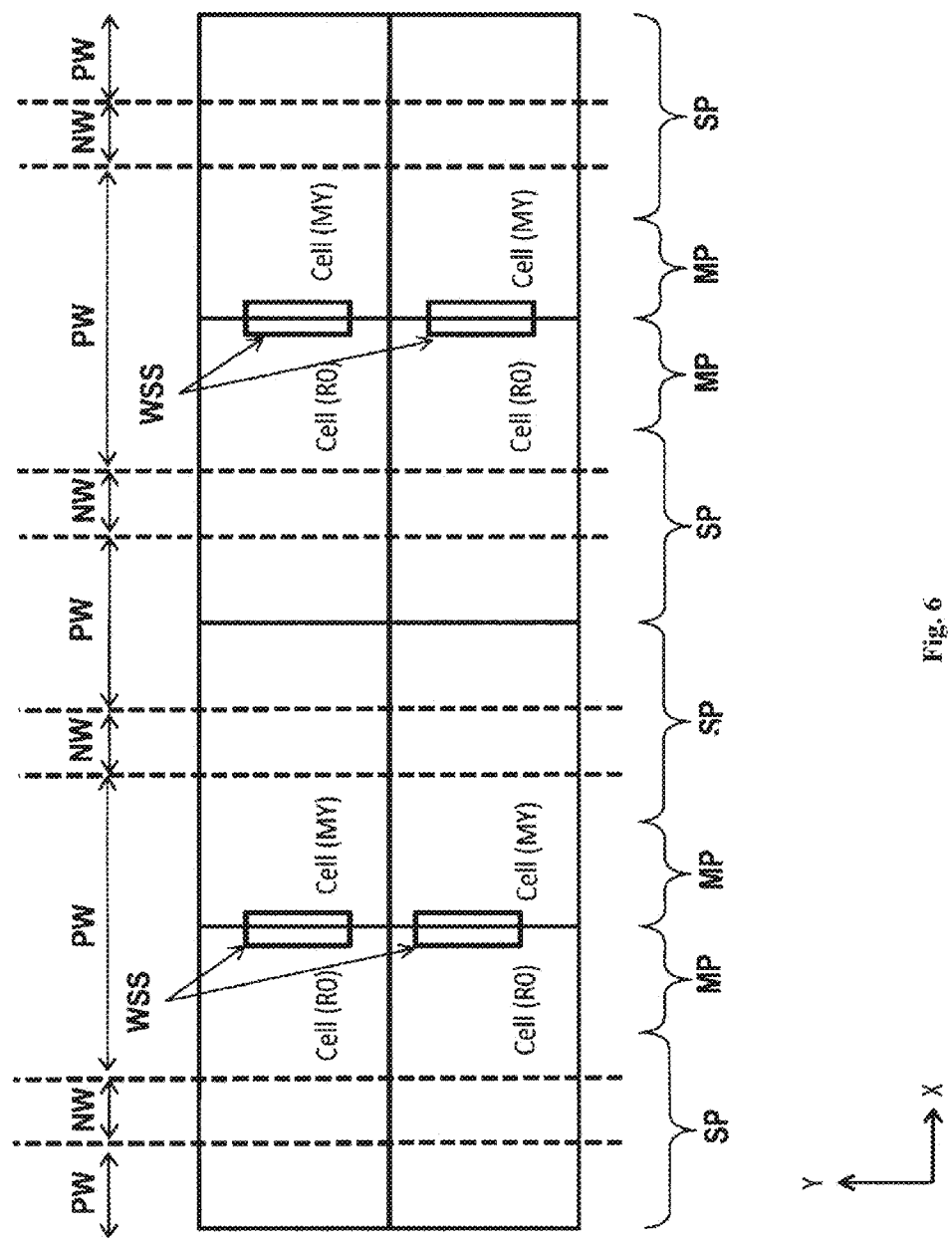
FIG. 6 is a 2×4 array of cells according to an embodiment of the present disclosure.
Figure 7:
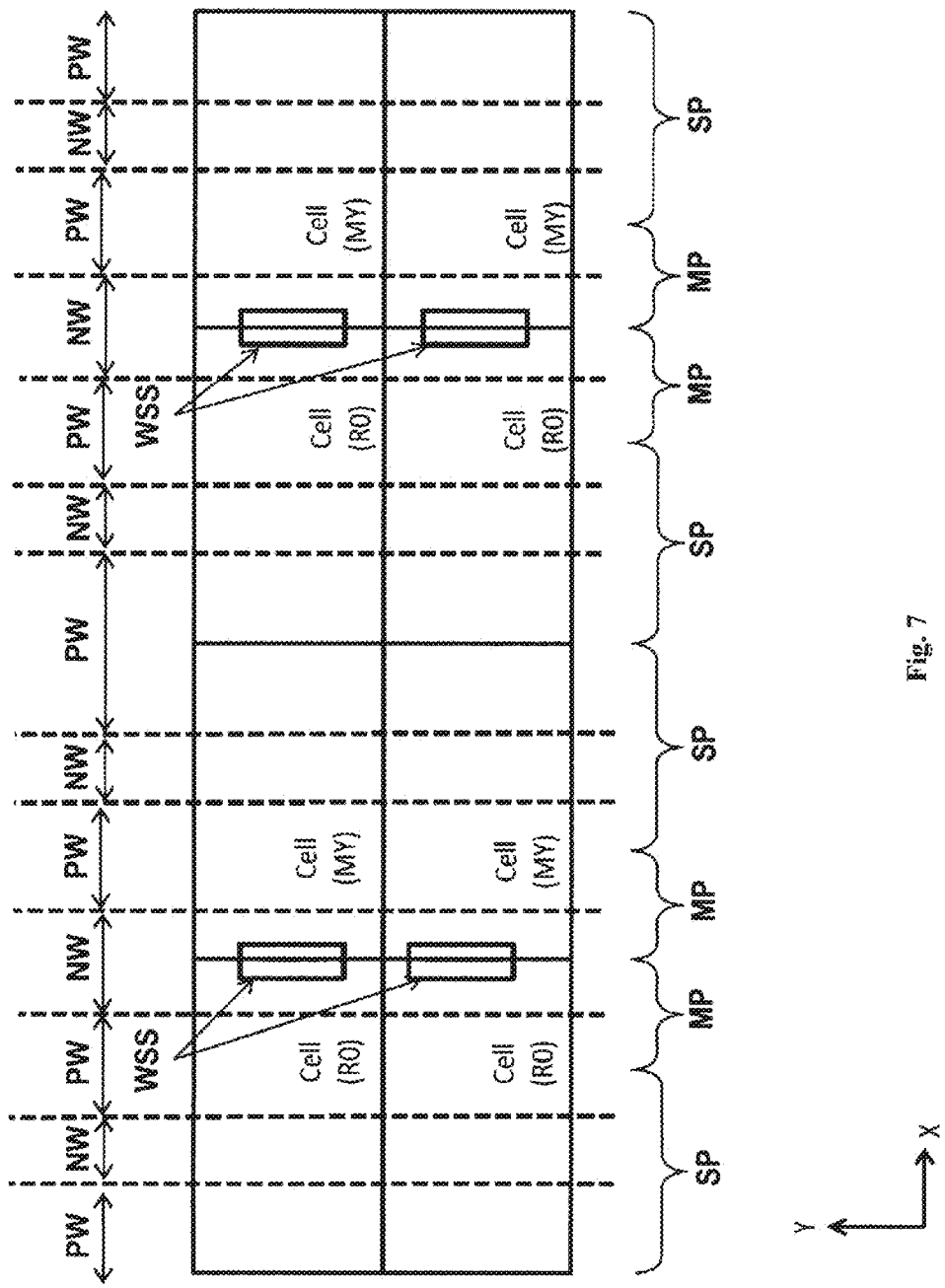
FIG. 7 is a 2×4 array of cells according to a further embodiment of the present disclosure.
Figure 8:
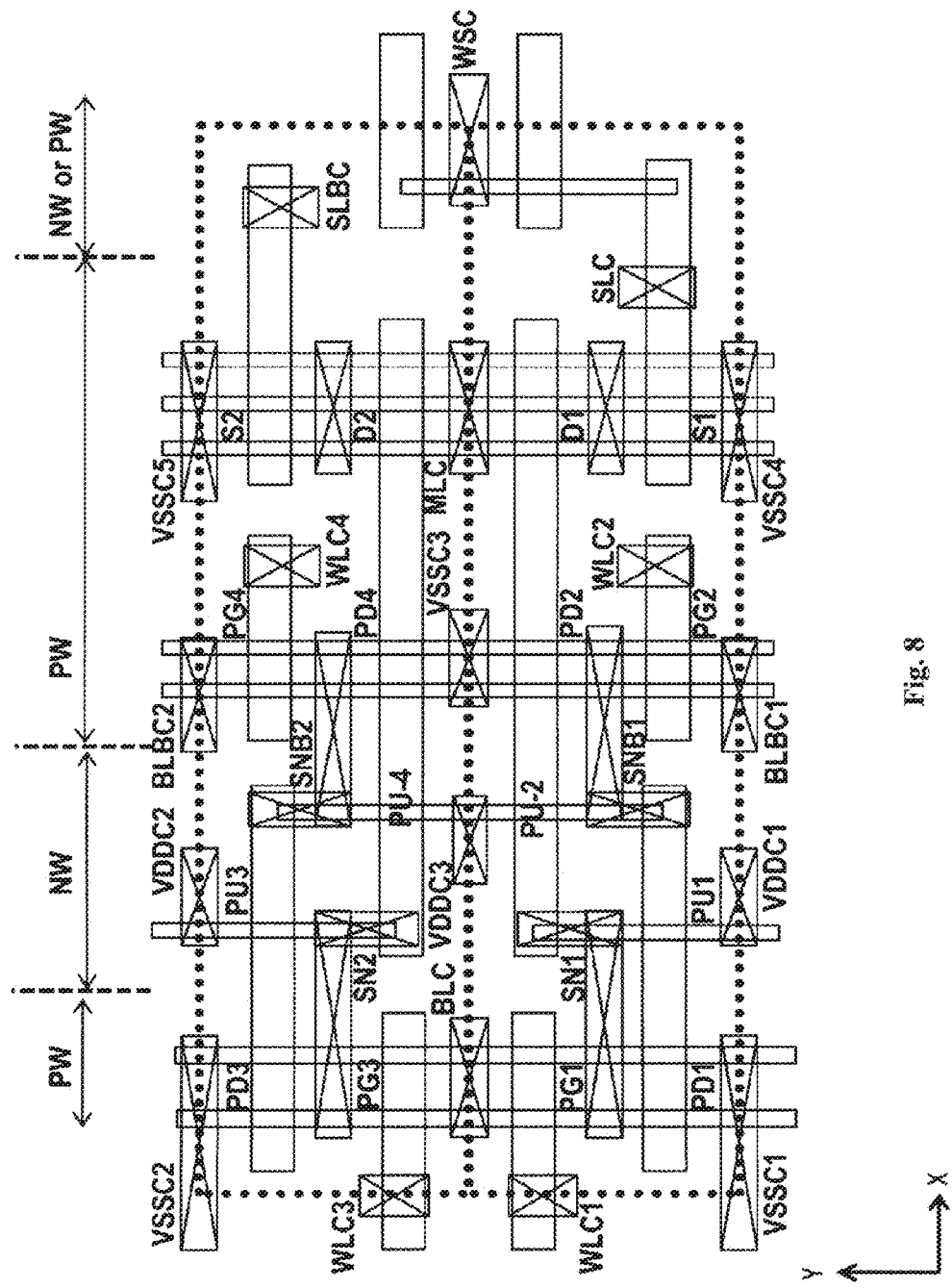
FIG. 8 is a third example cell layout for the cell in FIG. 1 according to an embodiment of the present disclosure.

FIG. 6 illustrates a 2.times.4 array (2×4 array) of cells according to an embodiment. FIG. 6 is a modification of FIG. 4 to include well strap structures WSS in each cell in respective p-doped wells PW. FIG. 7 is a further modification of FIG. 6 where the well strap structures WSS in each cell are formed in respective n-doped wells NW. In this example, the n-doped wells NW in which the well strap structures WSS are formed are shared across cells in an X-direction. Having wells PW and NW in this arrangement for each cell NW-PW-NW-PW) may reduce carrier diffusion through the substrate and may also reduce a soft error rate (SER). FIG. 8 illustrates a third example cell layout for the cell in FIG. 1 according to an embodiment. Although a layout is discussed corresponding to the cell in FIG. 1, a person of ordinary skill in the art will readily understand how to modify the layout in FIG. 8 to correspond to the cell in FIG. 2. The cell in FIG. 8 is a modification of the cell in FIG. 5. As previously discussed, the transistors may comprise one or more active areas. FIG. 8 is an example where transistors PD1, PG1, PG3, and PD3 comprise two active areas, and transistors PG2, PD2, PD4, and PG4 comprise two active areas. Further transistors S1, D1, D2, and S2 comprise three active areas.

Figure 9:
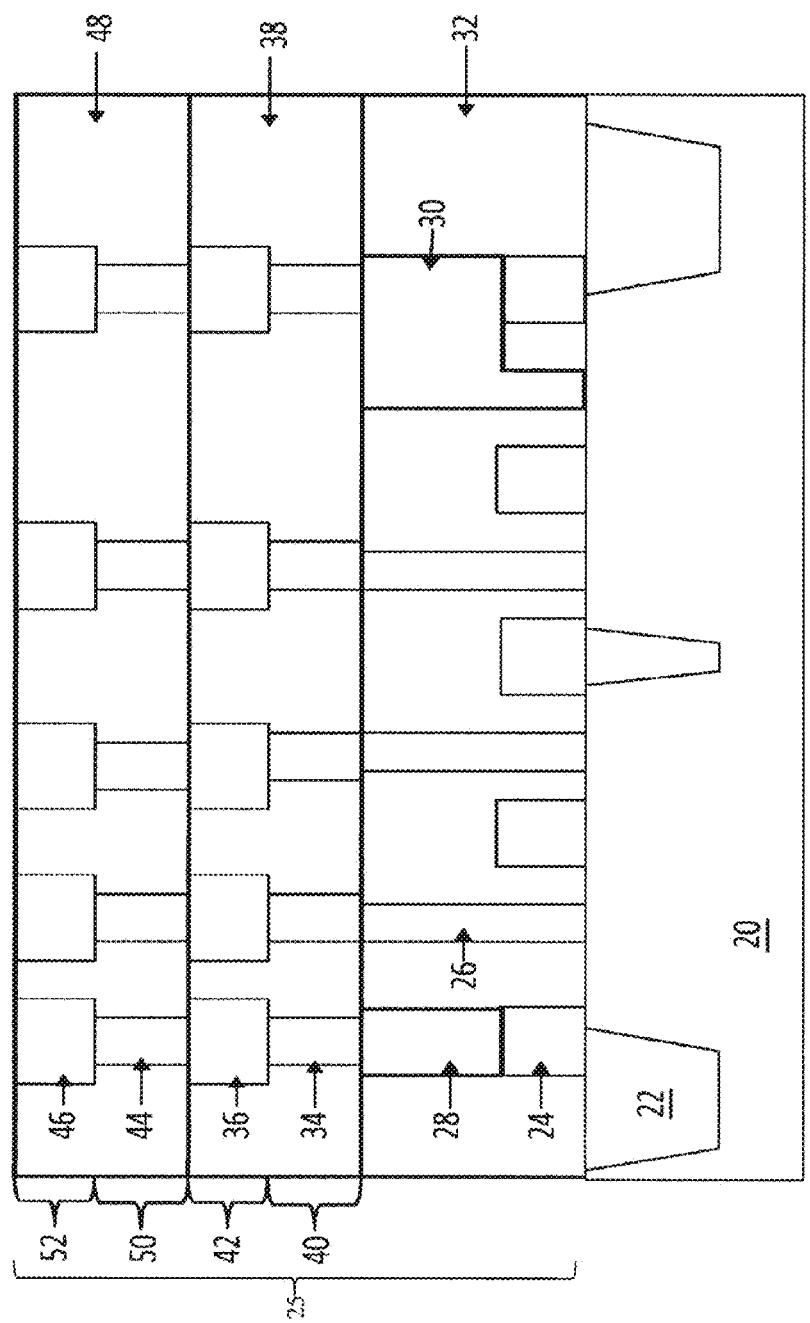
FIG. 9 is a representation of various layers and components that may be present in a structure according to an embodiment of the present disclosure.

FIG. 9 is a representation of various layers and components (e.g., metal layers containing metal lines, vias/contacts, etc.) that may be present in a structure according to an embodiment. The structure comprises a substrate 20, which may be a semiconductor substrate, like a bulk substrate, semiconductor on insulator (SOI) substrate, or the like. The substrate 20 comprises isolation regions 22, such as Shallow Trench Isolations (STIs), used to define active areas of the substrate 20. Gate structures 24, such as a conductive material (like doped polysilicon, a metal, a silicide, the like or a combination thereof) over a gate dielectric layer, are formed on the substrate 20.

An interconnect structure 25 is formed over the substrate 20. The interconnect structure 25 includes multiple metal layers metal-1, metal-2, etc.) that each contain a plurality of metal lines, as well as vias or contacts that provide electrical connectivity to the metal layers and the components formed in/on the substrate 20. Purely as examples, FIG. 9 illustrates substrate contacts 26 that are formed through a first dielectric layer 32, such as an inter-layer dielectric (ILD), to provide electrical connections to a microelectronic component in the substrate 20 (e.g., a doped region such as a source/drain). Gate contacts 28 may be formed through the first dielectric layer 32 to connect to a gate structure 24. A butted contact 30 may be formed through the first dielectric layer 32 to connect to a gate structure 24 and the substrate 20.

A second dielectric layer 38, such as an inter-metal dielectric (IMD), overlies the first dielectric layer 32. First vias 34 and first metal patterns 36 are in the second dielectric layer 38. The first vias 34 are in a first via layer 40. The first metal patterns 36 are in a first metallization layer (e.g., metal-1 or M1 layer). A third dielectric layer 48, such as an IMD, overlies the second dielectric layer 38. Second vias 44 and second metal patterns 46 are in the third dielectric layer 48. The second vias 44 are in a second via layer 50. The second metal patterns 46 are in a second metallization layer (e.g., metal-2 or M2 layer). FIG. 9 generally illustrates various components as simplified examples only, and a person of ordinary skill in the art will readily understand that modifications may be made to this structure.

Figure 10:
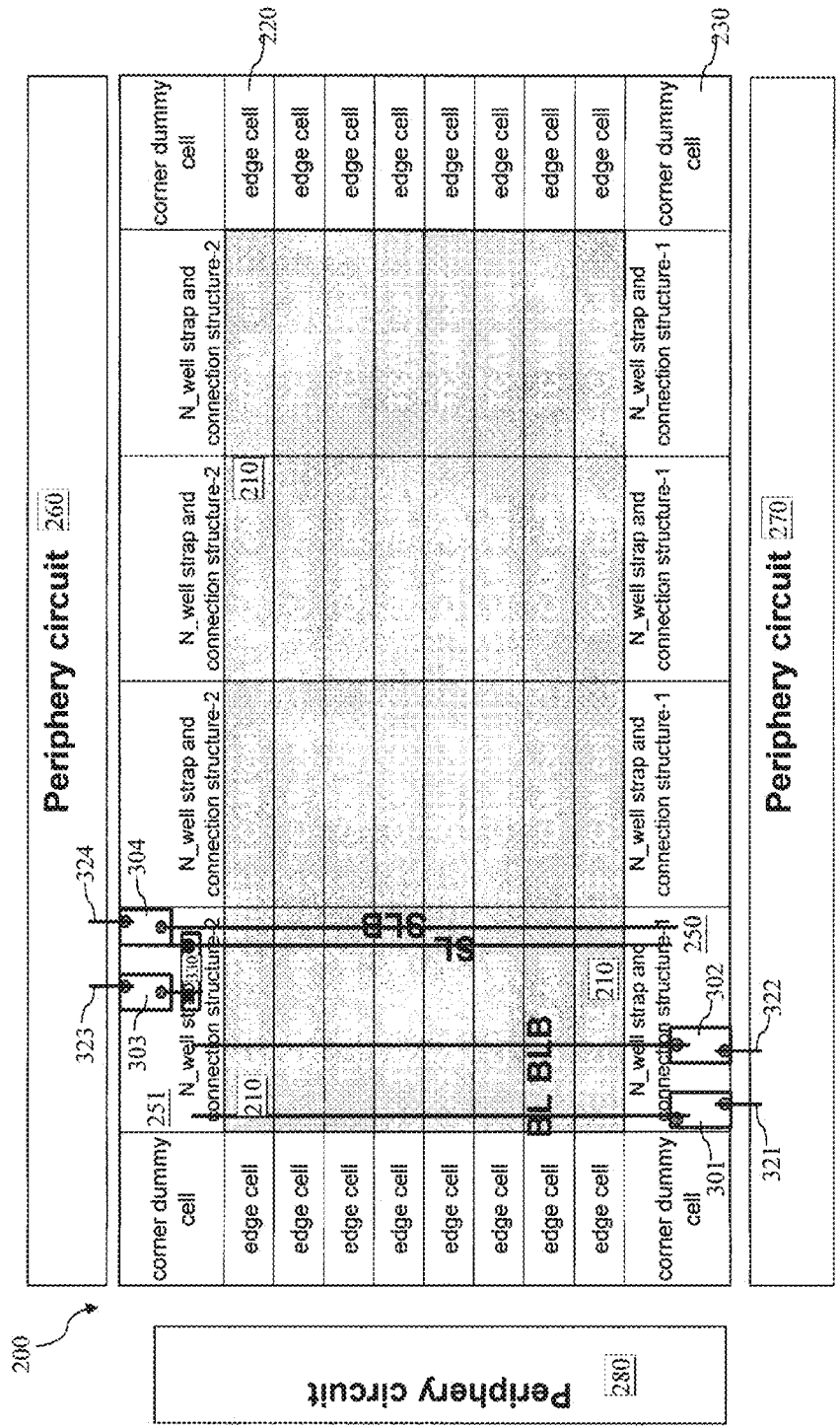
FIG. 10 is a simplified top view of a portion of a TCAM chip according to an embodiment of the present disclosure.

FIG. 10 is a simplified diagrammatic planar view (also referred to as a top view) of a portion of a TCAM array 200 according to embodiments of the present disclosure. The TCAM array includes a plurality of TCAM cells, an example one of which is labeled as TCAM cell 210. The TCAM cells 210 are arranged into a plurality of columns in a bit-line routing direction (e.g., vertical direction in FIG. 10) and a plurality of rows in a word-line routing direction (e.g., horizontal direction in FIG. 10). Within each TCAM cell 210, there are two SRAM (Static Random-Access Memory) cells and two sets of cascaded devices for data comparison purposes, as discussed above with reference to FIG. 1 or 2.

A plurality of signal lines or power lines may run through at least some of the TCAM cells 210. For example, as shown in FIG. 10, the signal lines may include a bit-line (BL), bit-line-complement (BLB, or bit-line bar), search-line (SL), search-line-complement (SLB, or search-line bar). Other signal/power lines that are not specifically shown in FIG. 10 for reasons of simplicity may include power lines like a Vdd line, a Vss line, a well strap conductor line, Vss power mesh lines (shared with adjacent cells), a first word-line, a second word-line, a match line, etc. Among these lines, the lines BL, BLB, SL, SLB, Vdd, Vss, and well-strap conductor line may be running in a first metal layer such as M1, and the lines like Vss power mesh lines, 1st word-line (WL-1), 2nd word-line (WL-2), and a match line may be running in a second metal layer such as M2 that is located above the first metal layer.

In addition to the TCAM cells 210, the TCAM array 200 also includes a plurality of edge cells such as edge cell 220, dummy cells such as corner dummy cell 230, and N-well strap cell and connection structures 250-251 (hereinafter referred to as "connection structures" for reasons of simplicity). The connection structure 250 is located on an edge (bottom edge) of the TCAM column, and the connection structure 251 is located on an opposite edge (top edge) of the TCAM column. The connection structures 250-251 are implemented at least in part to alleviate metal routing concerns, as discussed below in more detail. One or more connection structures 250-251 are implemented in each column of TCAM cells 210.

A plurality of periphery circuits 260, 270, and 280 may be located around the TCAM cells 210, the edge cells 220, the corner dummy cells 230, and the connection structures 250-251. The periphery circuits 260-280 contain logic circuits for interoperating with (or controlling) the TCAM array 200. For example, the periphery circuit 260 may include a driver for the search lines SL, as well as a column multiplexor MUX. The periphery circuit 270 may include a driver for the bit-lines BL, as well as the column multiplexor MUX. The periphery circuit 280 may include a driver for the word-lines WL-1 and/or WL-2, and a sense amplifier for the match lines. Of course, it is understood that these are purely examples, and that the periphery circuits 260-280 may be implemented differently or may include different components in alternative embodiments.

For the TCAM chip to function properly, appropriate electrical interconnections need to be established between the TCAM cells 210 and the periphery circuits 260-280. However, as the semiconductor fabrication progresses to smaller and smaller technology nodes, electrical connection issues may arise. For example, for certain small technology nodes, the routing rules may specify that the logic metal lines of the periphery circuits have to be 1-dimensional with a fixed metal pitch, with no "jog". In other words, the metal lines have to be straight and cannot bend in a different direction, unlike previous technology generations. These requirements may be due to spacer lithography process limitations. Meanwhile, the metal lines in the TCAM cells 210 (e.g., SRAM metal pins BL and WL) do not follow the logic metal rules. As such, the metal pins-out may become misaligned with the logic metal lines from the periphery circuits 260-280. When such misalignment occurs, the metal lines from the TCAM cells 210 (e.g., BL or WL) are unable to directly connect to the logic metal lines from the periphery circuits 260-280. As such, desired electrical connections cannot be properly established between the periphery circuits 260-280 and the TCAM cells 210.

In order to solve the metal routing problem discussed above, the present disclosure implements metal landing pads and/or longer contacts to serve as intermediate "bridging" structures to interconnect the misaligned metal lines from the periphery circuits 260-280 and the TCAM cells 210. For example, as shown in FIG. 10, a plurality of metal landing pads are implemented in the connection structures 250-251, for example metal landing pads 301, 302, 303, and 304.

In more detail, the metal landing pads 301-302 are located in the connection structure 250, and the metal landing pads 303-304 are located in the connection structure 251. It may be said that the metal landing pads 301-304 each extend (or are oriented) in the horizontal direction in FIG. 10, since they are located in a metal-2 layer where the metal lines each extend in the horizontal direction. In other words, each of the metal landing pads 301-304 may be viewed as an enlarged metal line in the metal-2 layer.

The metal landing pad 301 is electrically coupled to the bit-line BL and a metal line 321 from the periphery circuit 270. The metal landing pad 302 is electrically coupled to the bit-line-complement BLB and a metal line 322 from the periphery circuit 270. The metal landing pad 303 is electrically coupled to a metal line 323 from the periphery circuit 260, and to the search line SL (through a long contact 330). The metal landing pad 304 is electrically coupled to the search-line-complement SLB and a metal line 324 from the periphery circuit 260.

It is understood that these metal landing pads 301-304 are located in a M2 layer, whereas the metal lines BL, BLB, SL, SLB) that they are electrically coupled to are located in a M1 layer. This will avoid the "jog" that would have been needed if routing was to be accomplished in just one metal layer. This aspect of the present application will become more apparent based on the discussions below.

It is also understood that the metal landing pads 301-304 illustrated in FIG. 10 are just examples for a single column of TCAM cells, and that similar metal landing pads may be implemented in the corresponding connection structures 250 for each corresponding TCAM cell column.

Figure 11:
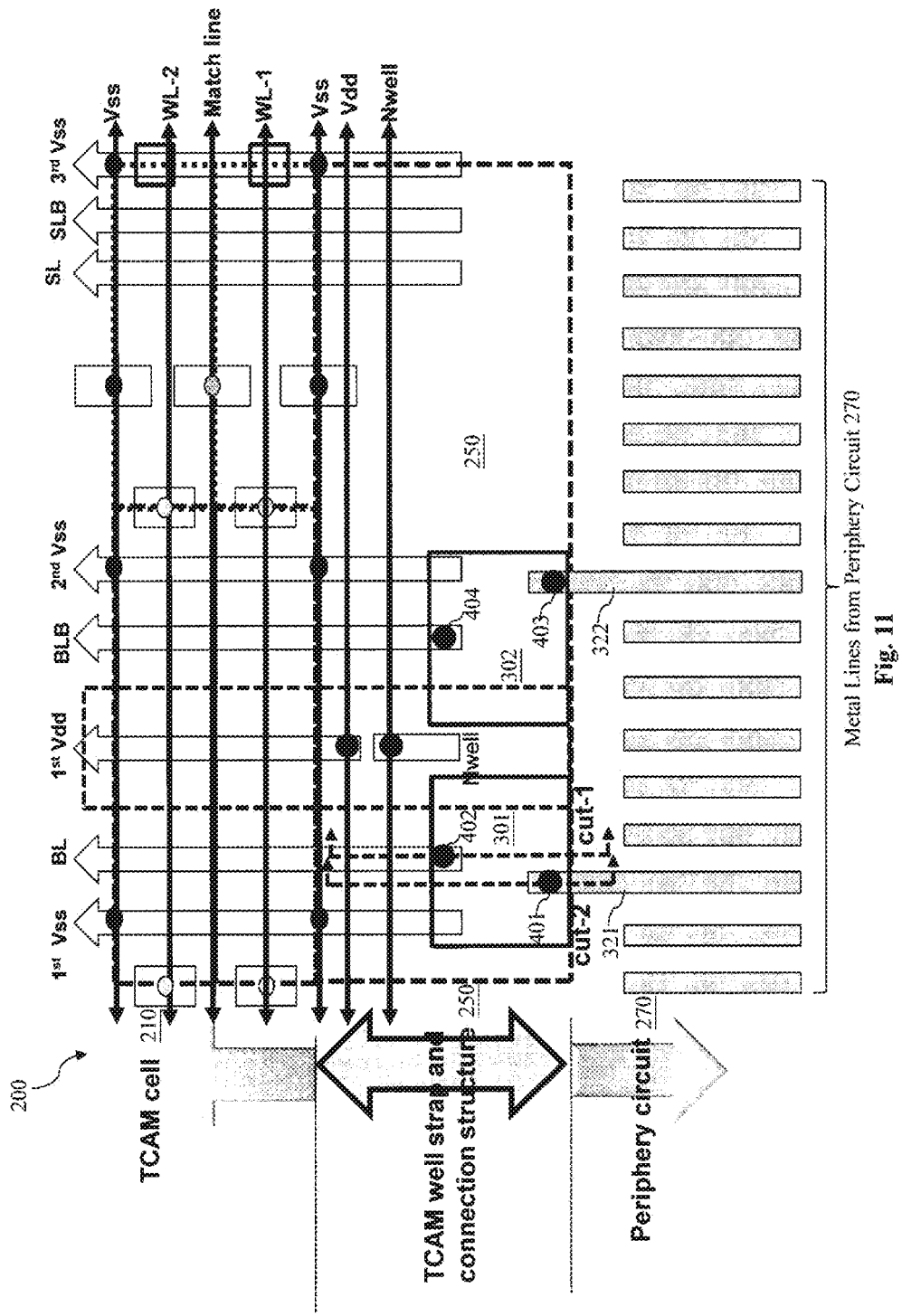
FIG. 11 is a simplified top view of a portion of the TCAM chip of FIG. 10 according to an embodiment of the present disclosure.

FIG. 11 is a more detailed planar view of a portion of the devices shown in FIG. 10. Specifically, FIG. 11 illustrates the partial planar views of one of the TCAM cells 210, the connection structure 250, and the periphery circuit 270. A plurality of signal lines and power lines are also illustrated. Implemented as metal lines, these signal and power lines may be located in different metal layers where the metal lines are oriented or extend in different directions. For example, in a metal-1 (M1) metal layer, metal lines 1st Vss, BL, 1st Vdd, BLB, 2nd Vss, and 3rd Vss are located and oriented vertically. In a metal-2 (M2) metal layer, metal lines Vss, WL-2, match line, WL-1, Vss, Vdd, and Nwell are located and oriented horizontally. Since these vertically-oriented and horizontally-oriented metal lines are located in different metal layers, there are no electrical shorting issues.

The periphery circuit 270 also includes a plurality of metal lines that are used for routing. Some of these metal lines, such as metal lines 321 and 322 (discussed above with reference to FIG. 10), need to be routed to (or electrically coupled to) the TCAM cells, for example to some of the signal lines such as BL and BLB. As can be seen from FIG. 11, the metal lines 321 and 322 are not aligned with the signal lines BL and BLB. Since the routing rules for advanced technology nodes do not allow "jog" or bending of the metal lines, the metal lines 321 or 322 cannot be directly connected to the signal lines BL and BLB using just one metal layer.

To overcome this metal routing problem, the present disclosure implements metal landing pads 301 and 302 in the connection structure 250. The metal landing pads 301 and 302 are located in a metal-2 layer, which may be located above the metal-1 layer in which the metal lines 321-322 and the signal lines BL and BLB reside. As shown in FIG. 11, the metal landing pad 301 is connected to the metal line 321 through a via 401, and to the signal line BL through another via 402. The metal landing pad 302 is connected to the metal line 322 through a via 403, and to the signal line BLB through another via 404. In other words, through the metal landing pad 301 and the vias 401-402, the metal line 321 from the periphery circuit 270 is electrically coupled to the signal line BL from the TCAM cell 210 without creating metal "jog" or bending, and through the metal landing pad 302 and the vias 403-404, the metal line 322 from the periphery circuit 270 is electrically coupled to the signal line BLB from the TCAM cell 210 without creating metal "jog" or bending.

Figure 12A:
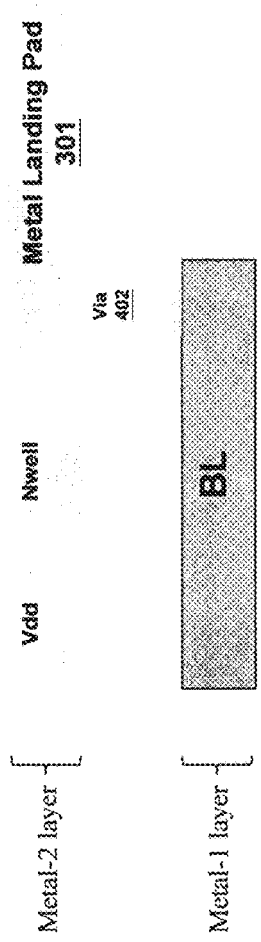
FIGS. 12A and 12B are simplified cross-sectional views of different portions of FIG. 11 according to an embodiment of the present disclosure.
Figure 12B:
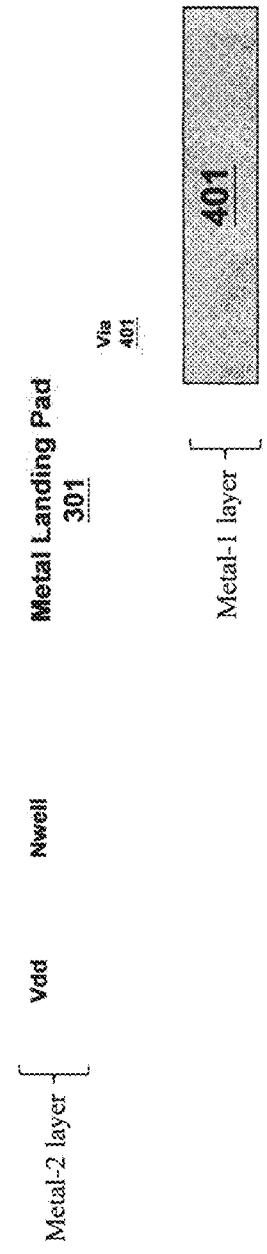

FIGS. 12A-12B are simplified diagrammatic cross-sectional side views of a portion of FIG. 11, so as to illustrate the use of the metal landing pad 301 in more detail. Specifically, FIG. 12A is taken along a cross-section cut-1 in FIG. 11, and FIG. 12B is taken along a cross-section cut-2 in FIG. 11. As shown in FIG. 12A, the metal landing pad 301, along with the signal/power lines Vdd and Nwell, are located in the metal-2 layer. The signal line BL is located in the metal-1 layer, which is one level below the metal-2 layer in the illustrated embodiment. The metal landing pad 301 is electrically coupled to the signal line BL through the via 402, which is located between the metal-1 and metal-2 layers.

FIG. 12B also shows the same metal landing pad 301 being located in the metal-2 layer, along with the signal/power lines Vdd and Nwell. However, since FIG. 12B is taken along a different cross-sectional cut than FIG. 12A, it shows a different portion of the metal landing pad 301. This portion of the metal landing pad 301 is electrically coupled to the metal line 401 (located in the metal-1 layer) from the periphery circuit 270 through the via 401, which similar to via 402, is also located between the metal-1 and metal-2 layers. Thus, FIGS. 12A-12B clearly illustrate how the metal landing pad 301 and the vias 401-402 are used to electrically coupled the signal line BL (from the TCAM cell 210) to the metal line 321 (from the periphery circuit 270), even though the signal line BL and the metal line 321 are misaligned in the planar view shown in FIG. 11. In a similar manner, the metal landing pad 302 and the vias 403-404 are used to electrically coupled the signal line BLB to the metal line 322.

Figure 13:
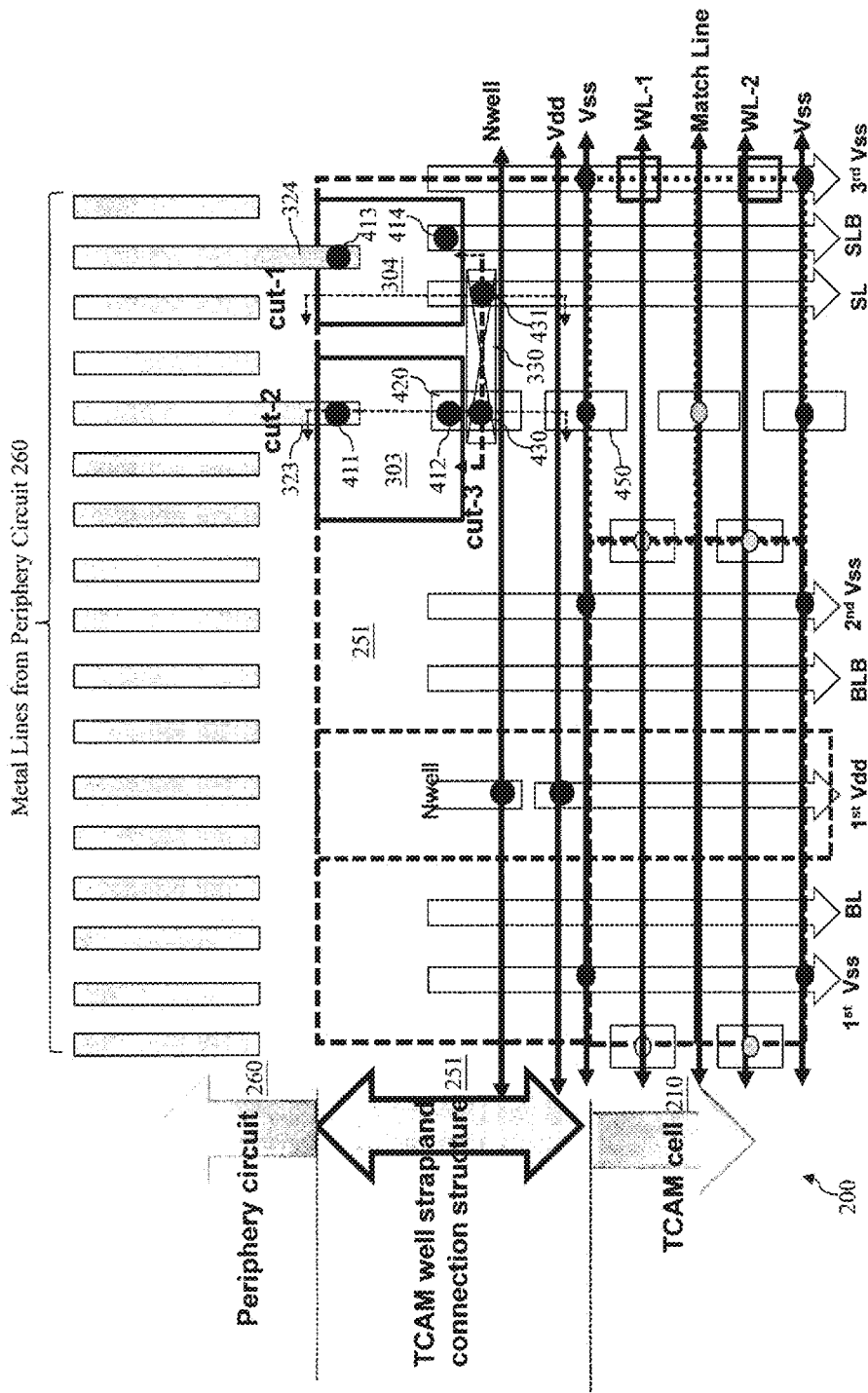
FIG. 13 is a simplified top view of another portion of the TCAM chip of FIG. 10 according to an embodiment of the present disclosure.

FIG. 13 is a more detailed planar view of another portion of the devices shown in FIG. 10. Specifically, FIG. 12 illustrates the partial planar views of one of the TCAM cells 210, the connection structure 251, and the periphery circuit 260. A plurality of signal lines and power lines are also illustrated. Implemented as metal lines, these signal and power lines may be located in different metal layers where the metal lines are oriented or extend in different directions. For example, in a metal-1 (M1) metal layer, metal lines 1st Vss, BL, 1st Vdd, BLB, 2nd Vss, SL, SLB, and 3rd Vss are located and oriented vertically. In a metal-2 (M2) metal layer, metal lines Vss, WL-2, match line, WL-1, Vss, Vdd, and Nwell are located and oriented horizontally. Since these vertically-oriented and horizontally-oriented metal lines are located in different metal layers, there are no electrical shorting issues.

The periphery circuit 260 also includes a plurality of metal lines that are used for routing. Some of these metal lines, such as metal lines 323 and 324 (discussed above with reference to FIG. 10), need to be routed to (or electrically coupled to) the TCAM cells, for example to some of the signal lines such as SL and SLB. As can be seen from FIG. 11, the metal lines 323 and 324 are not aligned with the signal lines SL and SLB. Since the routing rules for advanced technology nodes do not allow "jog" or bending of the metal lines, the metal lines 323 or 324 cannot be directly connected to the signal lines SL and SLB using just one metal layer.

To overcome this metal routing problem, the present disclosure implements metal landing pads 303 and 304 in the connection structure 251. The metal landing pads 303 and 304 are located in a metal-2 layer, which may be located above the metal-1 layer in which the metal lines 323-324 and the signal lines SL and SLB reside.

As shown in FIG. 13, the metal landing pad 303 is electrically coupled to the metal line 323 through a via 411, and to another metal line 420 (located in the metal-1 layer) through another via 412. The metal line 420 is electrically coupled to the long contact 330 discussed above with reference to FIG. 10 and located below the metal-1 layer through another via 430. The contact 330 is oriented (or extends) in a horizontal direction in FIG. 13, which is the same direction in which the word lines and other metal-2 layer metal lines are oriented, even though the contact 330 is not located in the metal-2 layer but is actually located below the metal-1 layer.

The long contact 330 is electrically coupled to the signal line SL (located in the metal-1 layer) through yet another via 431. In this manner, using the metal landing pad 303 and the long contact 330, the metal line 323 of the periphery circuit 260 is electrically coupled to the signal line SL of the TCAM cell 210. The implementation/use of the long contact 330 is due to the fact that the signal lines SL and SLB are adjacent to one another. For example, the signal lines BL and BLB are not adjacent to one another, since the power line 1st Vdd exists between BL and BLB (the Nwell also exists between BL and BLB). However, no other signal lines or power lines exist between SL and SLB, which means that SL and SLB are close to (adjacent to) each other. The adjacency of SL and SUB means that it would have been difficult to horizontally stretch the metal landing pad 303 (to the point where SL can be directly connected to the landing pad 303 through a via) without shorting the metal landing pad 304. The metal landing pad 304 is connected to the metal line 324 through a via 413, and to the signal line SLB through another via 414.

Based on the discussions above, it can be seen that through the metal landing pads 303-304, the long contact 330, and the vias 411-414, the metal lines 323-324 from the periphery circuit 260 can be electrically coupled to the signal lines SL and SLB from the TCAM cell 210, respectively, without creating metal "jog" or bending.

FIGS. 14A, 14B and 14C are simplified diagrammatic cross-sectional side views of different portions of FIG. 13, so as to illustrate the use of the metal landing pads 303-304 and the long contact 330 in more detail. Specifically, FIG. 14A is taken along a cross-section cut-1 in FIG. 13, FIG. 14B is taken along a cross-section cut-2 in FIG. 13, and FIG. 14C is taken along a cross-section cut-3 in FIG. 13.

As shown in FIG. 14A, the metal landing pad 304, along with the signal/power lines Vdd and Nwell, are located in the metal-2 layer. The signal line SL is located in the metal-1 layer, which is one level below the metal-2 layer in the illustrated embodiment. The search line SL is electrically coupled to the contact 330 through the via 431, which is located between the metal-1 and metal-2 layers. The contact 330 contains a conductive material and is located in a contact layer below the metal-1 layer. For example, the contact 330 may be implemented similar to the conductive contact 26 discussed above with reference to FIG. 9.

FIG. 14B shows the metal landing pad 303 being located in the metal-2 layer, along with the signal/power lines Vdd and Nwell. The metal landing pad 303 is electrically coupled to the metal line 323 (located in the metal-1 layer) from the periphery circuit 260 through the via 411, which is also located between the metal-1 and metal-2 layers. The metal landing pad 303 is also electrically coupled to the metal line 420 (located in the metal-1 layer) through the via 412. The metal line 420 is separated (and electrically isolated) from an adjacent metal line 450 (also shown in FIG. 13). The metal line 420 is electrically coupled to the contact 330 through the via 430.

FIG. 14C shows that one portion of the contact 330 is electrically coupled to the metal line 420 (also shown in FIG. 14B) through the via 430, and another portion of the contact 330 is electrically coupled to the signal line SL through the via 431.

Based on FIGS. 14A-14C, it can be seen how the signal line SL is electrically coupled to the metal line 323, namely through the metal landing pads 303-304, the long contact 330, the metal line 420, and the vias 411-412 and 430-431. This electrical connection is made in spite of the fact that the signal line SL of the TCAM cell 210 is misaligned with the metal line 323 of the periphery circuit 260 in the planar view shown in FIG. 13. Meanwhile, the signal line SLB is electrically coupled to the metal line 324 through the metal landing pad 304 and the vias 413-414, in a manner similar to what is discussed above with reference to FIGS. 12A-12B. Again, it is understood that the reason the long contact 330 is implemented is because the signal lines SL and SLB are adjacent to one another (e.g., located closely to one another), and the contact 330 helps route the signal line SL to its corresponding metal line 323 without causing electrically shorting out the signal line SLB.

Again, it is understood that the structures shown in FIGS. 11, 12A-12B, 13, and 14A-14C are for one TCAM cell column as an example. Similar structures may be repeated for other TCAM cell columns.

Figure 15:
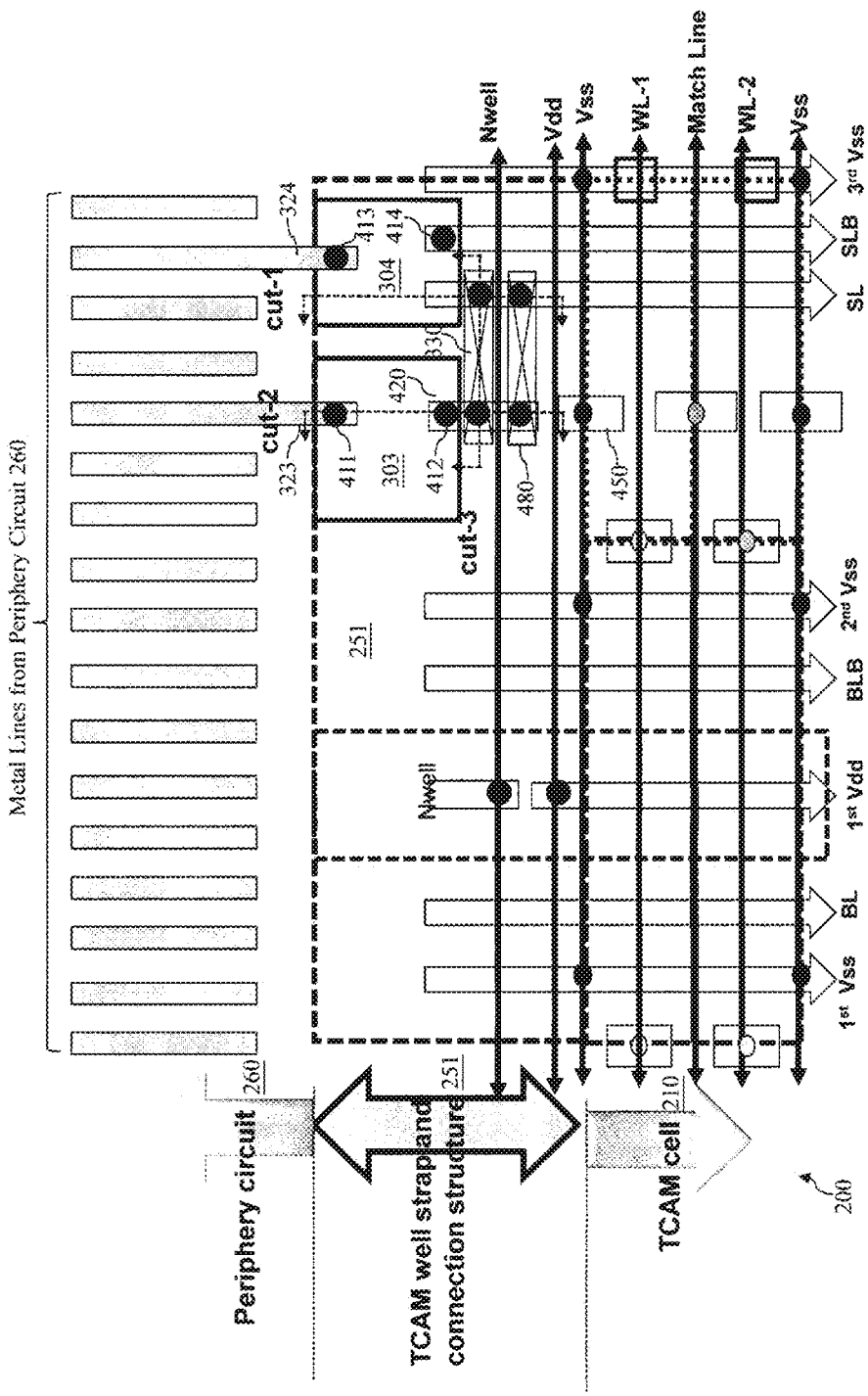
FIG. 15 is a simplified top view of another portion of the TCAM chip of FIG. 10 according to an embodiment of the present disclosure.

FIG. 15 illustrates another embodiment of the TCAM array in accordance with embodiments of the present disclosure. Specifically, FIG. 15 is a more detailed planar view of the TCAM cells 210, the connection structure 251, and the periphery circuit 260, similar to what is illustrated in FIG. 13. Therefore, for reasons of consistency and clarity, similar components appearing in FIGS. 13 and 15 are labeled the same. Similar to the embodiment of FIG. 13, the embodiment of FIG. 15 also uses metal pads 303-304 (located in the metal-2 layer) to help route the signal lines SL and SLB (located in the metal-1 layer) to the metal lines 323-324 that are located in the periphery circuit 260 (located in the metal-1 layer), which are misaligned with the signal lines SL and SLB. Unlike the embodiment of FIG. 13, however, the embodiment of FIG. 15 uses two long contacts the contact 330 and an extra contact 480 to electrically couple the signal line SL to the metal line 323 together. It is understood that in other embodiments, more than two contacts may be used, and the contacts need not necessarily be used only for the signal line SL, For example, in some embodiments, the contacts may be used for the signal line SLB (or other signal lines) as well, depending on the routing needs.

Figure 16:
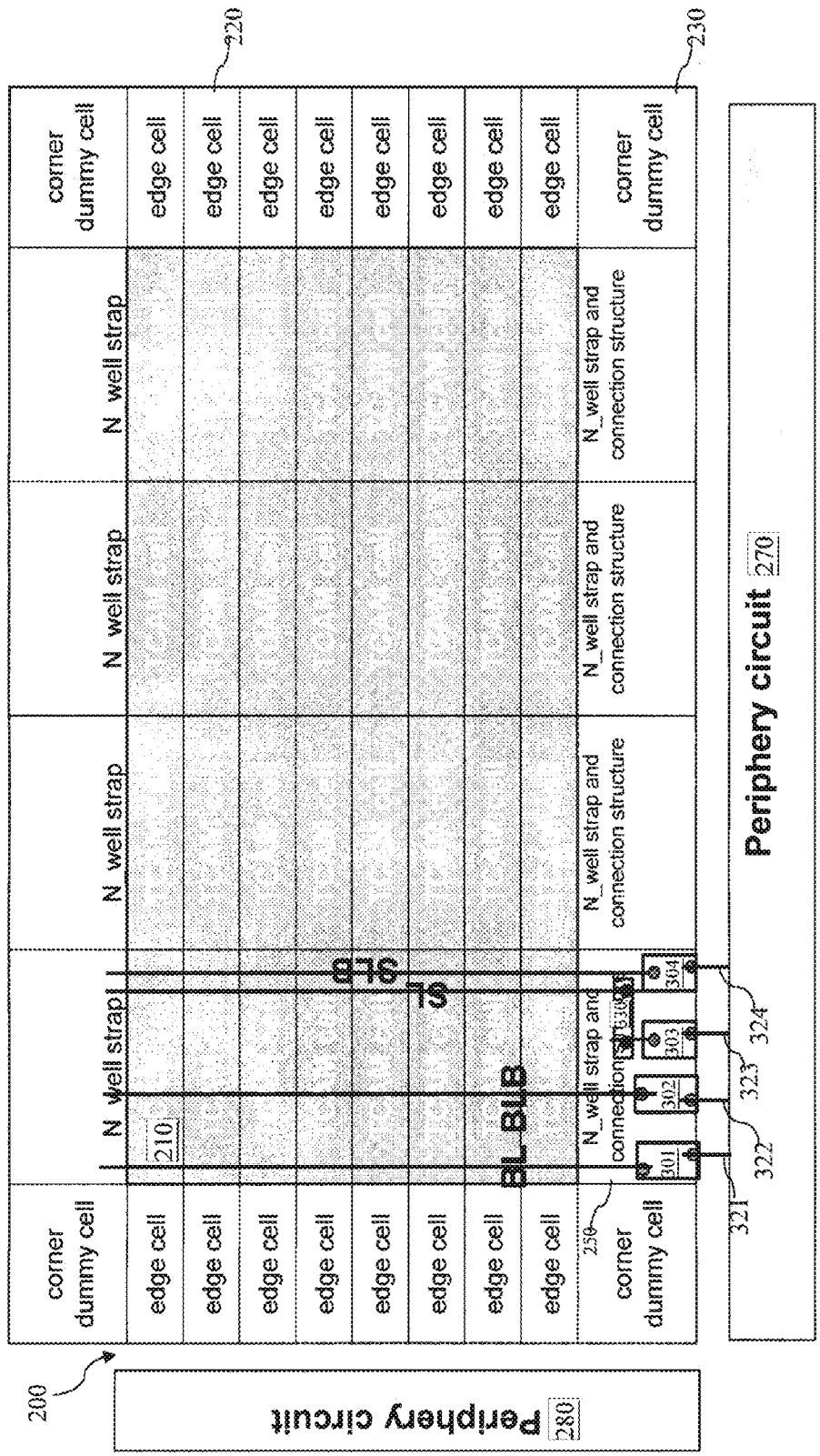
FIG. 16 is a simplified top view of a portion of a TCAM chip according to an embodiment of the present disclosure.

FIG. 16 illustrates a simplified diagrammatic planar view (also referred to as a top view) of a portion of a TCAM array 200 according to an alternative embodiments of the present disclosure. The embodiment shown in FIG. 16 is similar to the embodiment shown in FIG. 10, and thus similar components appearing in both FIGS. 10 and 16 are labeled the same for reasons of consistency and clarity. Similar to the embodiment shown in FIG. 10, the TCAM array 200 in FIG. 16 includes a plurality of TCAM cells 210, which are arranged into a plurality of columns in a bit-line routing direction (e.g., vertical direction in FIG. 16) and a plurality of rows in a word-line routing direction (e.g., horizontal direction in FIG. 16). Within each TCAM cell 210, there are two SRAM (Static Random-Access Memory) cells and two sets of cascaded devices for data comparison purposes, as discussed above with reference to FIG. 1 or 2. Edge cells 220 and dummy cells 230 are also included. Periphery circuits 270-280 are located around the TCAM array 200.

The TCAM array 200 also includes a plurality of N-well strap and connection structures (referred hereinafter as connection structures for reasons of simplicity) 250, for example a corresponding connection structure 250 for each column of TCAM cells. Similar to the connection structure 250 of FIG. 10, the connection structure 250 in FIG. 16 also contains metal landing pads to help route the metal lines from the periphery circuit 270. For example, each connection structure 250 may include metal landing pads 301, 302, 303, and 304. Similar to the embodiment of FIG. 10, the metal landing pads 301-302 help electrically couple the metal lines 321-322 from the periphery circuit 270 to the signal lines BL and BLB, respectively. For metal landing pads 303-304, they help electrically couple the metal lines 323-324 from the periphery circuit 270 to the signal lines SL and SLB, respectively.

However, whereas the metal landing pads 303-304 in FIG. 10 are implemented in a different connection structure 251 (e.g., at the "top" of the TCAM cell column), the metal landing pads 303-304 in FIG. 16 are implemented in the same connection structure 250 as the metal landing pads 301-302. And similar to the embodiment in FIG. 10, a long contact 330 is also used to help route the signal lines SL and SLB separately without causing an electrical short, since SL and SLB are located adjacent to one another. It is understood that in other embodiments, all four landing pads 301-304 may be implemented in the same connection structure similar to the connection structure 251 in FIG. 10.

Figure 17:
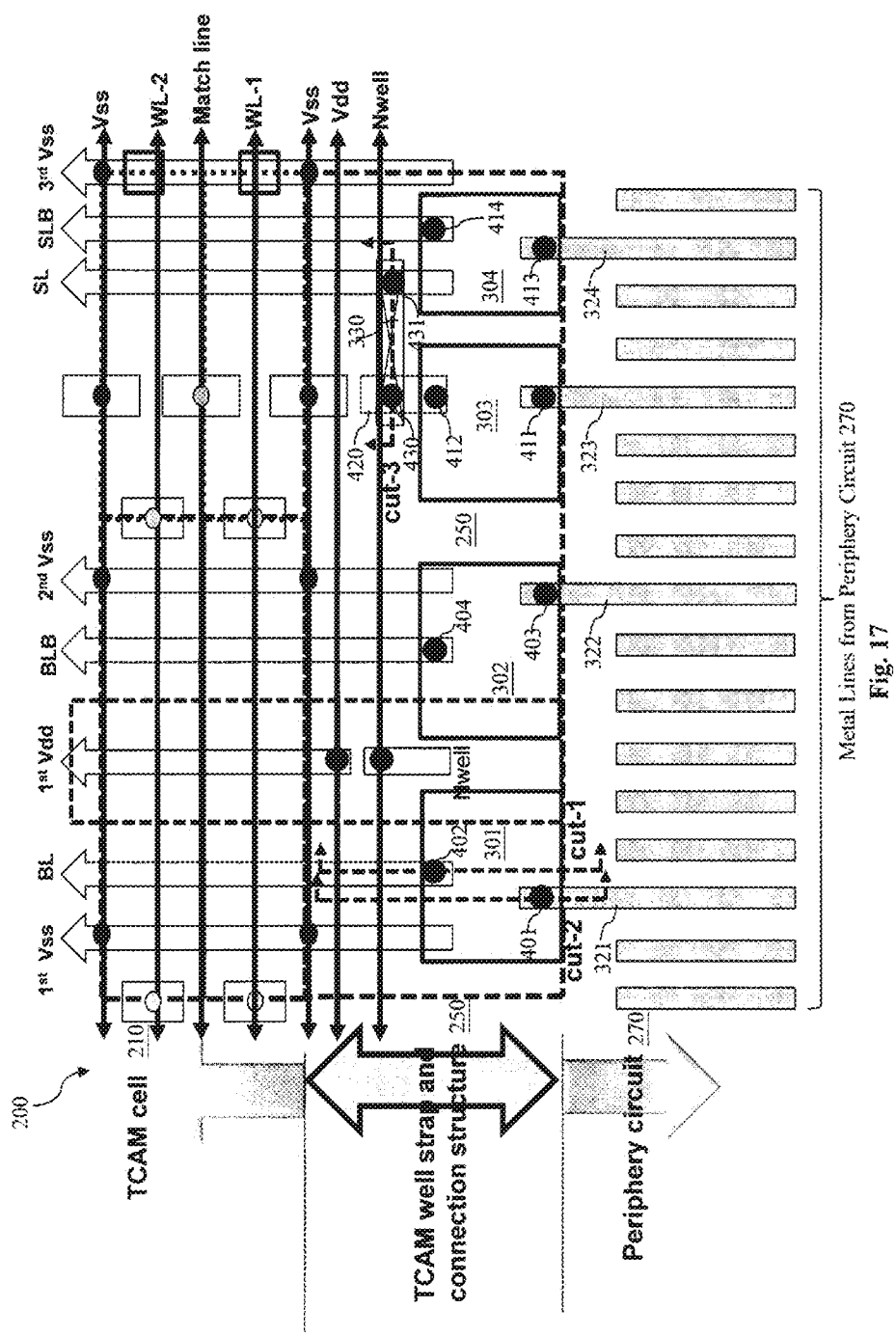
FIG. 17 is a simplified top view of a portion of the TCAM chip of FIG. 16 according to an embodiment of the present disclosure.

FIG. 17 is a more detailed planar view of a portion of the devices shown in FIG. 16. Specifically, FIG. 17 illustrates the partial planar views of one of the TCAM cells 210, the connection structure 250, and the periphery circuit 270. In other words, FIG. 17 is similar to FIG. 11, with the exception that metal landing pads 303-304 are also illustrated in the connection structure 250 in FIG. 17. Other similar components appearing in FIGS. 11 and 17 are labeled the same for reasons of clarity and consistency.

Similar to what has been discussed above with reference to FIG. 11, the metal landing pad 301 and the vias 401-402 provide electrical connections between the metal line 321 and the signal line BL, and the metal landing pad 302 and the vias 403-404 provide electrical connections between the metal line 322 and the signal line BLB. The functionalities of the metal landing pads 303-304, the contact 330, and the vias 411-414 and 430-431 are similar to the similarly labeled components discussed above with reference to FIG. 13. For example, the metal line 323 is electrically coupled to the signal line SL through the metal landing pad 303, the metal line 420, the contact 330, and the vias 411-412 and 430-431. The metal line 324 is electrically coupled to the signal line SLB through the metal landing pad 304 and the vias 413-414. It is also understood that more than one contact 330 may be implemented in alternative embodiments, similar to the embodiment shown in FIG. 15.

FIGS. 18A, 18C, and 18C are simplified diagrammatic cross-sectional side views of different portions of FIG. 17, so as to illustrate the use of the metal landing pad 301 and the contact 330 in more detail. Specifically, FIG. 18A is taken along a cross-section cut-1 in FIG. 17, and FIG. 18B is taken along a cross-section cut-2 in FIG. 17, and FIG. 18C is taken along a cross-section cut-3 in FIG. 17. Because of where the cuts-1/2/3 are made, FIG. 18A is substantially similar to FIG. 12A, FIG. 18B is substantially similar to FIG. 12B, and FIG. 18C is substantially similar to FIG. 14C. Again, for reasons of clarity and consistency, similar components appearing in FIGS. 12A/B, 14C, and FIGS. 18A-C are labeled the same, and detailed discussions regarding the various electrical interconnections with reference to FIGS. 18A-18C are not repeated herein, since they have already been discussed in detail with reference to FIGS. 12A-12B and 14C.

Figure 19:
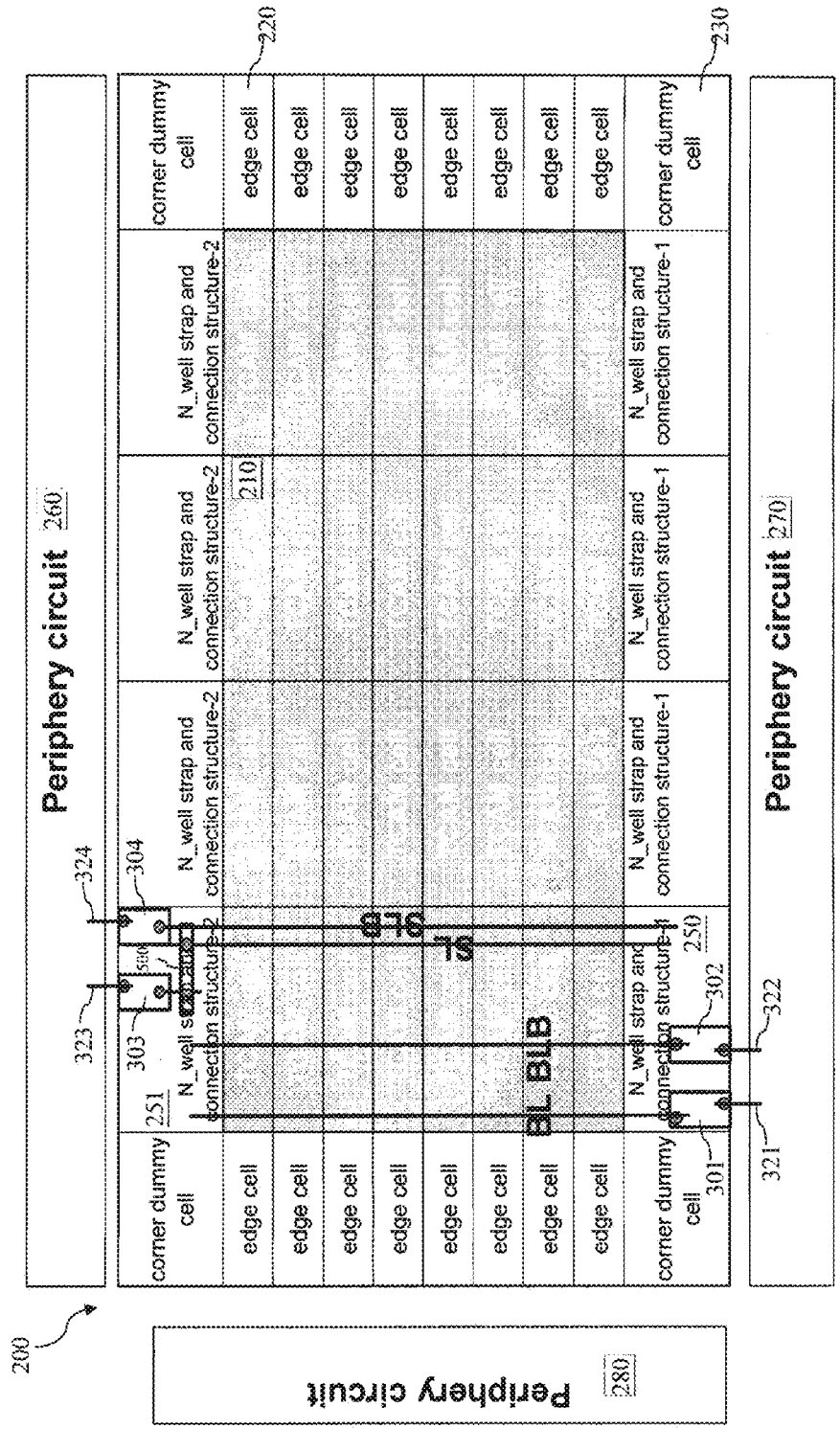
FIG. 19 is a simplified top view of a portion of a TCAM chip according to an embodiment of the present disclosure.

FIG. 19 illustrates a simplified diagrammatic planar view (also referred to as a top view) of a portion of a TCAM array 200 according to yet another alternative embodiments of the present disclosure. The embodiment shown in FIG. 19 is similar to the embodiment shown in FIG. 10, and thus similar components appearing in both FIGS. 10 and 19 are labeled the same for reasons of consistency and clarity. Similar to the embodiment shown in FIG. 10, the TCAM array 200 in FIG. 19 includes a plurality of TCAM cells 210, which are arranged into a plurality of columns in a bit-line routing direction (e.g., vertical direction in FIG. 19) and a plurality of rows in a word-line routing direction (e.g., horizontal direction in FIG. 19). Within each TCAM cell 210, there are two SRAM (Static Random-Access Memory) cells and two sets of cascaded devices for data comparison purposes, as discussed above with reference to FIG. 1 or 2. Edge cells 220 and dummy cells 230 are also included. Periphery circuits 260-280 are located around the TCAM array 200.

Also similar to FIG. 10, connection structures such as connection structures 250-251 are implemented for each TCAM column. Metal landing pads 301-302 are implemented in the connection structure 250, and metal landing pads 303-304 are implemented in the connection structure 251. Unlike the embodiment in FIG. 10, however, the embodiment in FIG. 19 uses a metal line 500 (instead of the long contact 330) to electrically couple the metal landing pad 303 to the signal line SL. The metal line 500 is located in the same layer (e.g., metal-2 layer) as the metal landing pads 303-304 and is oriented in a horizontal direction in FIG. 19. Functionally, the metal line 500 and the contact 330 are similar, even though the metal line 500 is located one metal layer above the metal line 323 and the signal line SL (they are in the metal-1 layer), whereas the contact 330 is located one metal layer below the metal lines 323 and the signal line SL.

It is understood that although the embodiments discussed above use the connection structures implemented as the top and/or bottom edges of the column of TCAM cells to establish electrical connections between the misaligned metal lines from the periphery circuits and the TCAM cells, the connection structures may also be implemented elsewhere in other embodiments. For example, connection structures may be implemented at the left and/or side edges of the rows of the TCAM cells if metal lines from the periphery circuit 280 (located to the left of the TCAM array 200) are misaligned with signal lines or power lines that run horizontally (e.g., Vdd, Vss, WL-1, match line, etc.). Using the same concept discussed above, metal landing pads may be used to establish electrical connections between these misaligned metal lines, though the metal landing pads in these connection structures may be located in a metal-1 layer or a metal-3 layer, since the misaligned metal lines needing electrical connections are located in the metal-2 layer.

It is further understood that although the embodiments discussed above have implemented the metal landing pads in a $M_{X+1}$ (e.g., metal-2) metal layer to electrically connect misaligned metal lines located in a $M_X$ (e.g., metal-1) layer, this is not required. In other embodiments, the metal landing pads may be implemented in a $M_{X+3}$ metal layer for example, or a $M_{X-1}$ metal layer.

Figure 20:
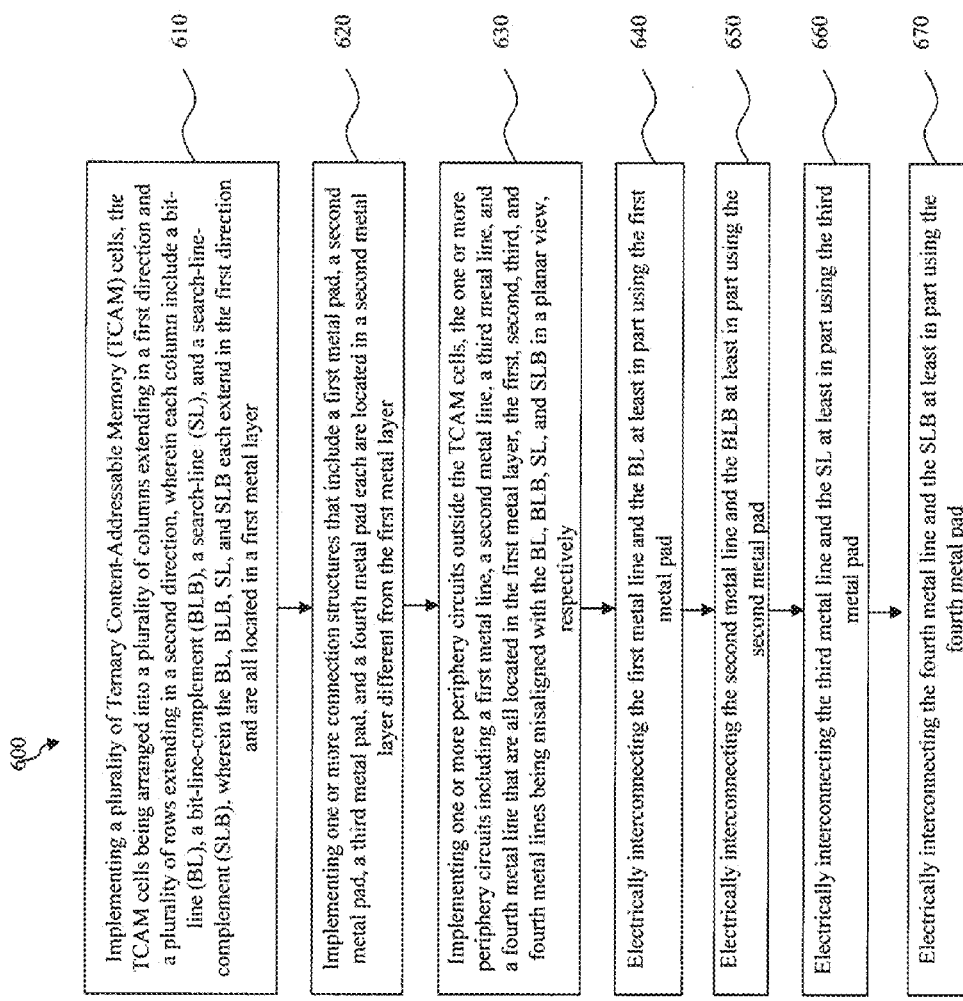
FIG. 20 is a flowchart illustrating a method according to an embodiment of the present disclosure.

FIG. 20 is a flowchart illustrating a method 600. The method 600 includes a step 610 of implementing a plurality of Ternary Content-Addressable Memory (TCAM) cells. The TCAM cells are arranged into a plurality of columns extending in a first direction and a plurality of rows extending in a second direction. Each column includes a bit-line (BL), a bit-line-complement (BLB), a search-line (SL), and a search-line-complement (SLB). The BL, BLB, SL, and SLB each extend in the first direction and are all located in a first metal layer.

The method 600 includes a step 620 of implementing one or more connection structures that include a first metal pad, a second metal pad, a third metal pad, and a fourth metal pad each are located in a second metal layer different from the first metal layer.

The method 600 includes a step 630 of implementing one or more periphery circuits outside the TCAM cells. The one or more periphery circuits include a first metal line, a second metal line, a third metal line, and a fourth metal line that are all located in the first metal layer. The first, second, third, and fourth metal lines being misaligned with the BL, BLB, SL, and SLB in a planar view (e.g., top view), respectively.

The method 600 includes a step 640 of electrically interconnecting the first metal line and the BL at least in part using the first metal pad.

The method 600 includes a step 650 of electrically interconnecting the second metal line and the BLB at least in part using the second metal pad.

The method 600 includes a step 660 of electrically interconnecting the third metal line and the SL at least in part using the third metal pad.

The method 600 includes a step 670 of electrically interconnecting the fourth metal line and the SLB at least in part using the fourth metal pad.

In some embodiments, the first metal layer is a $M_X$ layer that does not allow bending or jogging of metal lines located therein, and the second metal layer is a $M_{X+1}$ or a $M_{X-1}$ layer.

In some embodiments, no other signal lines are located between the SL and the SLB, and the method 600 may further include a step of implementing a contact that extends in a second direction perpendicular to the first direction, and another step of electrically interconnecting the SL and the third metal line at least in part using the contact.

It is understood that additional processes may be performed before, during, or after the steps 610-670 of the method 600. For reasons of simplicity, these additional steps are not discussed herein in detail.

Based on the above discussions, it can be seen that the present disclosure offers advantages over conventional TCAM devices. It is understood, however, that other embodiments may offer additional advantages, and not all advantages are necessarily disclosed herein, and that no particular advantage is required for all embodiments. One advantage is that it is compatible with spacer lithography that is used to fabricate semiconductor devices in advanced technology nodes. In advanced technology nodes, the routing rules may prohibit metal line bending or jogging that was allowed in previous (older) technology nodes. The metal lines of a periphery logic circuit and the signal lines (BL, SL, BLB, SLB) of TCAM cells may have different pitch sizes. As such, the metal lines and the signal lines may become misaligned and cannot be connected directly to one another. The present disclosure overcomes this problem by using metal pads located in a different metal layer than the misaligned metal lines and signal lines. As such, the present disclosure allows the TCAM cells to be electrically coupled to the periphery logic circuits properly without creating metal line bending or metal jogging. This approach also conserves chip layout area. In addition, by using one or more long contacts or an additional metal line, the search-line (SL) and the search-line-complement (SLB) may still be properly coupled to their intended metal lines in the periphery circuit, despite the fact that the SL and SLB are located adjacent to one another (e.g., having no other signal lines therebetween). Furthermore, the embedded P-well strap structures in every cell provides better latch up immunity.

One aspect of the present disclosure pertains to an electronic circuit. The electronic circuit includes a Ternary Content-Addressable Memory (TCAM) array. The TCAM array includes a plurality of TCAM cells that include a first signal line. The first signal line is located in a first metal layer. The TCAM array includes a connection structure that includes a first metal landing pad. The first metal landing pad is located in a second metal layer different from the first metal layer. The electronic circuit includes a periphery circuit located near the TCAM array. The periphery circuit includes a first metal line located in the first metal layer. The first metal line extends in a direction parallel to the first signal line but is misaligned with the first signal line in a planar view. The first metal landing pad is electrically coupled to both the first signal line and the first metal line.

Another aspect of the present disclosure pertains to an electronic device. The electronic includes a Ternary Content-Addressable Memory (TCAM) array. The TCAM array includes a plurality of TCAM cells that are arranged into a plurality of columns extending in a first direction and a plurality of rows extending in a second direction wherein each column include a bit-line (BL), a bit-line-complement (BLB), a search-line (SL), and a search-line-complement (SLB). The BL, BLB, SL, and SLB each extend in the first direction and are all located in a first metal layer. The TCAM array includes one or more connection structures in which a first metal pad, a second metal pad, a third metal pad, and a fourth metal pad are located. The first, second, third, and fourth metal pads are located in a second metal layer different from the first metal layer. One or more periphery circuits are located near the TCAM array. The one or more periphery circuits include a first metal line, a second metal line, a third metal line, and a fourth metal line. The first, second, third, and fourth metal lines each extend in the first direction and are all located in the first metal layer. The first metal line is misaligned with the BL in a planar view. The second metal line is misaligned with the BLB in the planar view. The third metal line is misaligned with the SL in the planar view. The fourth metal line is misaligned with the SLB in the planar view. The first metal line is electrically coupled to the BL at least in part using the first metal pad. The second metal line is electrically coupled to the BLB at least in part using the second metal pad. The third metal line is electrically coupled to the SL at least in part using the third metal pad. The fourth metal line is electrically coupled to the SLB at least in part using the fourth metal pad.

Yet another aspect of the present disclosure pertains to a method. A plurality of Ternary Content-Addressable Memory (TCAM) cells is implemented. The TCAM cells are arranged into a plurality of columns extending in a first direction and a plurality of rows extending in a second direction. Each column includes a bit-line (BL), a bit-line-complement (BLB), a search-line (SL), and a search-line-complement (SLB). The BL, BLB, SL, and SLB each extend in the first direction and are all located in a first metal layer. One or more connection structures are implemented that include a first metal pad, a second metal pad, a third metal pad, and a fourth metal pad each are located in a second metal layer different from the first metal layer. One or more periphery circuits are implemented outside the TCAM cells, the one or more periphery circuits including a first metal line, a second metal line, a third metal line, and a fourth metal line that are all located in the first metal layer. The first, second, third, and fourth metal lines are misaligned with the BL, BLB, SL, and SLB in a planar view, respectively. The first metal line and the BL are electrically interconnected together at least in part using the first metal pad. The second metal line and the BLB are electrically interconnected together at least in part using the second metal pad. The third metal line and the SL are electrically interconnected together at least in part using the third metal pad. The fourth metal line and the SLB are electrically interconnected together at least in part using the fourth metal pad.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit line conductor and word line conductor, one can achieve different resistances for the conductors. However, other techniques to vary the resistances of the metal conductors may also be utilized as well.

What is claimed is:

1. An electronic circuit, comprising:
   a Ternary Content-Addressable Memory (TCAM) array, wherein the TCAM array includes:
      a plurality of TCAM cells that include a first signal line, the first signal line being located in a first metal layer; and
      a connection structure that includes a first metal landing pad, the first metal landing pad being located in a second metal layer different from the first metal layer; and
   a periphery circuit located near the TCAM array, the periphery circuit including a first metal line located in the first metal layer;
   wherein:
   the first metal line extends in a direction parallel to the first signal line but is misaligned with the first signal line in a planar view; and
   the first metal landing pad is electrically coupled to both the first signal line and the first metal line.

2. The electronic circuit of claim 1, wherein:
   the TCAM cells further include a second signal line located in the first metal layer;
   the periphery circuit further includes a second metal line located in the first metal layer, the second metal line extending in a direction parallel to the second signal line but is misaligned with the second signal line in the planar view;
   the connection structure further includes a second metal landing pad located in the second metal layer; and
   the second metal landing pad is electrically coupled to both the second signal line and the second metal line.

3. The electronic circuit of claim 2, wherein:
   the TCAM cells further include a third signal line and a fourth signal line each located in the first metal layer;
   the periphery circuit further includes a third metal line and a fourth metal line each located in the first metal layer, the third metal line being misaligned with the third signal line in the planar view, and the fourth metal line being misaligned with the fourth signal line in the planar view;
   the connection structure further includes a third metal landing pad and a fourth metal landing pad each located in the second metal layer;
   the third metal landing pad is electrically coupled to both the third signal line and the third metal line; and the fourth metal landing pad is electrically coupled to both the fourth signal line and the fourth metal line.

4. The electronic circuit of claim 3, wherein:
the first signal line is a bit-line (BL);
the second signal line is a bit-line-complement (BLB);
the third signal line is a search-line (SL); and
the fourth signal line is a search-line-complement (SLB).

5. The electronic circuit of claim 4, wherein:
the connection structure further includes a first contact that extends in a direction perpendicular to the direction in which the first metal line extends;
no other signal lines are located between the third signal line and the fourth signal line; and
the third signal line is electrically coupled to the third metal line at least in part using the first contact.

6. The electronic circuit of claim 5, wherein:
the connection structure further includes a second contact that extends in a direction parallel to the first contact; and
the third signal line is electrically coupled to the third metal line at least in part using both the first contact and the second contact.

7. The electronic circuit of claim 4, wherein:
the connection structure further includes a fifth metal line that extends in a direction perpendicular to the direction in which the first metal line extends;
the fifth metal line is located in the second metal layer;
no other signal lines are located between the third signal line and the fourth signal line; and
the third signal line is electrically coupled to the third metal line at least in part using the fifth metal line.

8. The electronic circuit of claim 3, wherein:
the connection structure includes a first connection structure and a second connection structure different from the first connection structure;
the first metal landing pad and the second metal landing pad are located within the first connection structure;
the third metal landing pad and the fourth metal landing pad are located within the second connection structure;
the periphery circuit includes a first periphery circuit and a second periphery circuit different from the first periphery circuit;
the first metal line and the second metal line are from the first periphery circuit; and
the third metal line and the fourth metal line are from the second periphery circuit.

9. The electronic circuit of claim 8, wherein:
the plurality of TCAM cells are arranged into a plurality of columns and a plurality of rows;
the first connection structure is located near a first edge of one of the columns of the TCAM cells;
the second connection structure is located near a second edge of the one of the columns of the TCAM cells, the second edge being opposite the first edge;
the first periphery circuit is located near the first connection structure; and
the second periphery circuit is located near the second connection structure.

10. The electronic circuit of claim 9, wherein:
the first periphery circuit includes a driver for a bit-line (BL); and
the second periphery circuit includes a driver for a search-line (SL).

11. The electronic circuit of claim 1, wherein:
the first metal layer is a $M_X$ layer that does not allow bending or jogging of metal lines located therein; and
the second metal layer is a $M_{X+1}$ or a $M_{X-1}$ layer.

12. An electronic device, comprising:
a Ternary Content-Addressable Memory (TCAM) array, wherein the TCAM array includes:
a plurality of TCAM cells that are arranged into a plurality of columns extending in a first direction and a plurality of rows extending in a second direction, wherein each column include a bit-line (BL), a bit-line-complement (BLB), a search-line (SL), and a search-line-complement (SLB), wherein the BL, BLB, SL, and SLB each extend in the first direction and are all located in a first metal layer; and
one or more connection structures in which a first metal pad, a second metal pad, a third metal pad, and a fourth metal pad are located, the first, second, third, and fourth metal pads being located in a second metal layer different from the first metal layer; and
one or more periphery circuits located near the TCAM array, the one or more periphery circuits including a first metal line, a second metal line, a third metal line, and a fourth metal line, wherein the first, second, third, and fourth metal lines each extend in the first direction and are all located in the first metal layer;
wherein:
the first metal line is misaligned with the BL in a planar view;
the second metal line is misaligned with the BLB in the planar view;
the third metal line is misaligned with the SL in the planar view;
the fourth metal line is misaligned with the SUB in the planar view;
the first metal line is electrically coupled to the BL at least in part using the first metal pad;
the second metal line is electrically coupled to the BLB at least in part using the second metal pad;
the third metal line is electrically coupled to the SL at least in part using the third metal pad; and
the fourth metal line is electrically coupled to the SLB at least in part using the fourth metal pad.

13. The electronic device of claim 12, wherein:
the one or more connection structures further include a first contact that extends in a second direction perpendicular to the first direction;
no other signal lines are located between the SL and the SUB; and
the SL is electrically coupled to the third metal line at least in part using the first contact.

14. The electronic device of claim 13, wherein:
the one or more connection structures further include a second contact that extends in the second direction; and
the SL is electrically coupled to the third metal line at least in part using both the first contact and the second contact.

15. The electronic device of claim 12, wherein:
the one or more connection structures further include a fifth metal line that extends in a direction perpendicular to the direction;
the fifth metal line is located in the second metal layer;
no other signal lines are located between the SL and the SLB; and
the SL is electrically coupled to the third metal line at least in part using the fifth metal line.

16. The electronic device of claim 12, wherein:
the one or more connection structures include a first connection structure located at a bottom of the columns and a second connection structure located at a top of the columns;

the first metal pad and the second metal pad are located within the first connection structure;
the third metal pad and the fourth metal pad are located within the second connection structure;
the periphery circuit includes a first periphery circuit containing a bit-line driver and a second periphery circuit containing a search-line driver;
the first periphery circuit is located near the first connection structure;
the second periphery circuit is located near the second connection structure;
the first metal line and the second metal line are from the first periphery circuit; and
the third metal line and the fourth metal line are from the second periphery circuit.

17. The electronic device of claim 12, wherein:
the first metal layer is a metal-1 layer in which jogging or bending of metal lines is prohibited; and
the second metal layer is a metal-2 layer.

18. A method, comprising:
implementing a plurality of Ternary Content-Addressable Memory (TCAM) cells, the TCAM cells being arranged into a plurality of columns extending in a first direction and a plurality of rows extending in a second direction, wherein each column includes a bit-line (BL), a bit-line-complement (BLB), a search-line (SL), and a search-line-complement (SLB), wherein the BL, BLB, SL, and SLB each extend in the first direction and are all located in a first metal layer;
implementing one or more connection structures that include a first metal pad, a second metal pad, a third metal pad, and a fourth metal pad each are located in a second metal layer different from the first metal layer; and
implementing one or more periphery circuits outside the TCAM cells, the one or more periphery circuits including a first metal line, a second metal line, a third metal line, and a fourth metal line that are all located in the first metal layer, wherein the first, second, third, and fourth metal lines are misaligned with the BL, BLB, SL, and SLB in a planar view, respectively;
electrically interconnecting the first metal line and the BL at least in part using the first metal pad;
electrically interconnecting the second metal line and the BLB at least in part using the second metal pad;
electrically interconnecting the third metal line and the SL at least in part using the third metal pad; and
electrically interconnecting the fourth metal line and the SLB at least in part using the fourth metal pad.

19. The method of claim 18, wherein no other signal lines are located between the SL and the SLB, and wherein the method further comprises:
implementing a contact that extends in a second direction perpendicular to the first direction; and
electrically interconnecting the SL and the third metal line at least in part using the contact.

20. The meth of claim 18, wherein:
the first metal layer is a $M_X$ layer that does not allow bending or jogging of metal lines located therein; and
the second metal layer is a $M_{X+1}$ or a $M_{X-1}$ layer.

* * * * *